United States Patent
Sakakibara et al.

(10) Patent No.: US 6,466,484 B2
(45) Date of Patent: Oct. 15, 2002

(54) NONVOLATILE SEMICONDUCTOR MEMORY DEVICE CAPABLE OF SUPPRESSING REDUCTION OF BIT LINE POTENTIAL IN WRITE-BACK OPERATION AND ERASE METHOD

(75) Inventors: Kiyohiko Sakakibara, Hyogo (JP); Susumu Takeuchi, Hyogo (JP); Makoto Yamamoto, Hyogo (JP); Kunio Tani, Hyogo (JP); Yukio Nakamoto, Hyogo (JP); Tomohisa Iba, Hyogo (JP)

(73) Assignees: Mitsubishi Denki Kabushiki Kaisha, Tokyo (JP); Mitsubishi Electric Engineering Company Limited, Tokyo (JP)

(*) Notice: Subject to any disclaimer, the term of this patent is extended or adjusted under 35 U.S.C. 154(b) by 0 days.

(21) Appl. No.: 10/056,107

(22) Filed: Jan. 28, 2002

(65) Prior Publication Data

US 2002/0071314 A1 Jun. 13, 2002

Related U.S. Application Data

(62) Division of application No. 09/588,645, filed on Jun. 7, 2000, now Pat. No. 6,356,480.

(30) Foreign Application Priority Data

Aug. 26, 1999 (JP) .............................. 11-239526

(51) Int. Cl.[7] .............................. G11C 16/04

(52) U.S. Cl. .............................. 365/185.29; 365/185.22; 365/185.3

(58) Field of Search .................. 365/185.22, 185.01, 365/185.29, 185.3, 185.11, 185.21

(56) References Cited

U.S. PATENT DOCUMENTS

| | | | |
|---|---|---|---|
| 5,546,340 A | 8/1996 | Hu et al. ................. | 365/185.3 |
| 5,598,368 A | 1/1997 | Takahashi et al. ...... | 365/185.01 |
| 5,602,789 A | 2/1997 | Endoh et al. ............. | 365/201 |
| 5,724,300 A | 3/1998 | Tanaka et al. ........... | 365/230.06 |
| 5,867,430 A | 2/1999 | Chen et al. ............. | 365/189.04 |
| 5,909,397 A | 6/1999 | San et al. ............... | 365/185.24 |
| 6,219,280 B1 | 4/2001 | Naganawa ............. | 365/185.22 |

FOREIGN PATENT DOCUMENTS

| | | |
|---|---|---|
| JP | 7-182877 | 7/1995 |
| JP | 8-102198 | 4/1996 |
| JP | 8-106793 | 4/1996 |
| JP | 8-138394 | 5/1996 |
| JP | 10241382 | 9/1998 |
| JP | 11066898 | 3/1999 |
| WO | WO 97/15928 | 5/1997 |

OTHER PUBLICATIONS

"A Self–Convergence Erase for NOR Flash EEPROM Using Avalanche Hot Carrier Injection", S. Yamada et al., IEEE Trans. Electron Devices, vol. 43, 1996, pp. 1937–1941.

"A Novel Floating–Gate Method for Measurement of Ultra–Low Hole and Electron Gate Currents in MOS Transistors", Y. Nissan–Cohen, J. Electron Device Letters, vol. EDL. 7, No. 10, Oct. 1986, pp. 561–563.

"Failure Mechanisms of Flash Cell in Program/Erase Cycling", P. Cappelletti et al., IEDM94, 1994, pp. 291–294.

*Primary Examiner*—Michael S. Lebentritt
*Assistant Examiner*—Hien Nguyen
(74) *Attorney, Agent, or Firm*—McDermott, Will & Emery

(57) ABSTRACT

A nonvolatile semiconductor memory device selects a bit line while a word line is in a non-selected state, and self-selectively writes back only a cell in an overerased state on the selected bit line. The nonvolatile semiconductor memory device performs this write-back operation after completion of erase verification. At this time, current sensitivity of a sense current amplifier defining the threshold of a memory cell is set in view of an off-state leakage current of a memory cell transistor.

8 Claims, 31 Drawing Sheets

NONVOLATILE SEMICONDUCTOR MEMORY DEVICE CAPABLE OF SUPPRESSING REDUCTION OF BIT LINE POTENTIAL IN WRITE-BACK OPERATION AND ERASE METHOD

This application is a divisional of application Ser. No. 09/588,645 filed Jun. 7, 2000 now U.S. Pat. No. 6,356,480.

BACKGROUND OF THE INVENTION

1. Field of the Invention

The present invention relates to a nonvolatile semiconductor memory device having floating-gate storage elements and a driving method therefor.

2. Description of the Prior Art

FIG. 25 is a circuit block diagram showing a memory cell array of a conventional nonvolatile semiconductor memory device such as a NOR flash memory.

Referring to FIG. 25, the so-called floating-gate memory cell transistors are arranged on the intersections between word lines WLn−1 to WLn+1 and bit lines BLn−1 to BLn+1. The word lines are connected with the gates of the memory cell transistors and the bit lines are connected with the drains of the memory cell transistors.

The sources of the memory cell transistors belonging to the same memory cell columns are connected to source lines SL in common.

(1) Overerased State of Flash Memory

An overerased state of the flash memory is now described.

If any cell present on a bit line has a depressed threshold voltage Vth (Vth<0), the threshold voltages Vth of all the remaining cells present on the bit line cannot be correctly measured in a flash memory having the aforementioned NOR array structure or an array structure referred to as a DINOR (divided bit line NOR) structure described later. In other words, it is difficult to perform a normal read operation as to the memory cells connected to this bit line.

When the threshold voltage Vth of the memory cell arranged on the intersection between the bit line BLn and the word line WLn is depressed in FIG. 25, for example, the threshold voltages Vth of the remaining cells present on the bit line BLn cannot be measured due to influence by the cell located on the intersection between the bit line BLn and the word line WLn even if the threshold voltages Vth of the remaining cells are enhanced (Vth>0). In other words, it follows that all threshold voltages Vth are measured as apparently not more than 0 V.

FIG. 26 illustrates apparent threshold voltage distribution of memory cell transistors including such an overerased memory cell. FIG. 26 shows distribution of the number (bit number) of memory cells having thresholds Vth.

When investigating the distribution of the thresholds Vth in the memory cell array including the overerased memory cell (having the depressed threshold voltage Vth) as described above, cells proportionate to the number of cells present on the same bit line are determined as having threshold voltages Vth less than zero.

Therefore, the number of bits apparently corresponding to the threshold voltages Vth of zero corresponds to the sum of the memory cells coupled to the bit line including such an overerased memory cell, as shown in FIG. 26.

Such a depressed cell can occur since electrons are accidentally excessively extracted from a floating gate in the flash memory.

(2) Repair Method for Overerased Cell

Some conventional methods of selectively returning the threshold of an overerased memory cell to an enhanced state are now described as methods of repairing the overerased memory cell after an erase operation.

In the following description, the operation of returning the threshold voltage Vth of the overerased cell to the enhanced state is referred to as "write-back".

Some methods have been reported in relation to write-back processing.

(2-1) Method of Selecting Overerased Bit and Injecting Electrons in CHE Mode A method employing channel hot electrons (hereinafter abbreviated as CHE) is known as one of methods of injecting electrons into the floating gate of the cell in the flash memory.

Writing with CHE is a method of injecting high-energy electrons accelerated beyond the barrier height of an oxide film into a floating gate FG among channel electrons accelerated by a steep electric field in the vicinity of the drain of the memory cell.

FIG. 27 is a schematic sectional view of a flash memory cell for illustrating write-back of an overerased bit with CHE.

Referring to FIG. 27, a gate oxide film 13, a floating gate 14 consisting of polycrystalline silicon or the like, an insulating film 15 having a three-layer structure, referred to as an ONO structure, of an oxide film, a nitride film and an oxide film for preventing leakage and a control gate 16 consisting of polycrystalline silicon or the like are stacked on a P-type semiconductor substrate 11. N-channel source and drain regions 12a and 12b are formed in a self-alignment manner in proximity to the aforementioned stacked gates on the P-type semiconductor substrate 11.

A source voltage Vs, a drain voltage Vd, a control voltage Vcg and a substrate voltage Vsub are applied to the source region, the drain region, the control gate and the substrate 11 respectively. The control voltage Vcg is generally set higher than the drain voltage Vd.

The threshold voltage Vth of the memory cell can be enhanced by writing back the overerased cell in the CHE mode. However, the write-back in the CHE mode has the following problems:

First, the overerased cell must be selected. In other words, the write-back operation is performed after selecting the overerased cell, and hence the circuit structure for implementing selection of the overerased cell is disadvantageously complicated.

Second, a desired voltage for implementing the write-back operation in the CHE mode must be set between the drain and the gate. The desired voltage requires potential arrangement different from that bringing cell into a written state in general. The different potential arrangement is required since the width fluctuating the threshold voltage Vth of the memory cell to be written back is different from the fluctuation width in the conventional write operation.

Third, a channel current must be driven in write-back.

In order to drive the channel current, several 10 μA is required for each cell as the drain current Id of the memory cell transistor.

(2-2) Method of Self-Selectively Writing Back Overerased Bit

(2-2-1) Write-Back with Drain Avalanche Gate Current

The write-back operation in the CHE mode requires a circuit structure capable of selecting the overerased cell as described above.

A write-back method employing a gate current caused by drain avalanche hot electrons (hereinafter abbreviated as DAHE) or drain avalanche hot holes (hereinafter abbreviated as DAHH) is reported in "A Self-Convergence Erase for NOR Flash EEPROM Using Avalanche Hot Carrier Injection" by Yamada et al., IEEE Trans. Electron Devices, Vol. 43, p. 1937 (1996: hereinafter referred to as literature 1) as a method requiring no such bit selection.

A flash memory employing the CHE mode has a high $P^+$ substrate concentration (up to about $10^{18}$ cm$^{-3}$) and a dense $N^+$ diffusion layer (up to about $10^{20}$ cm$^{-3}$), in order to improve the efficiency of CHE. Spreading of a depletion layer is suppressed only in the P-type substrate region, for improving the CHE efficiency.

The aforementioned literature 1 also describes that the injection rate of As into the drain is $5 \times 10^{15}$ cm$^{-2}$, and the concentration of the $N^+$ diffusion layer exceeds $10^{20}$ cm$^{-3}$ after heat treatment under such injection condition.

FIG. 28 is a conceptual diagram showing dependency of logarithmic values of the drain current Id and the gate current Ig on a gate voltage Vg in the flash memory cell having such a drain structure.

As to the gate current Ig, is known that currents of DAHH, DAHE and CHE modes are observed in a gate voltage region where the channel current flows from the lower side of the gate voltage Vg as shown in FIG. 28.

Such a state is described in the aforementioned literature 1 and other literature such as literature 2: "A Novel Floating-Gate Method for Measurement of Ultra-Low Hole and Election Gate Currents in MOS Transistors" by Y. Nissan-Cohen, J. Electron Device Letter, Vol. EDL. 7, No. 10, Octeber, pp. 561–563 (1986) or U.S. Pat. No. 5,546,340 or literature 3: "Failure Mechanisms of Flash Cell in Program/Erase Cycling" by P. Cappelletti et al., IEDM 94, pp. 291–294, for example.

As described below, an overerased state can be self-convergently written back by utilizing the DAHH/DAHE current mode.

FIG. 29 is a schematic sectional view for illustrating a conventional operation of writing back an overerased bit with DAHE/DAHH. Referring to FIG. 29, the memory cell is similar in structure to the aforementioned memory cell written back with CHE, and hence redundant description is not repeated.

However, the method of applying a voltage to an electrode is different. A GND level is applied with respect to Vcg and GND or negative bias is applied with respect to Vsub.

FIG. 30 shows a result of evaluation of write-back in the overerased bit write-back method with DAHE/DAHH as time change of the threshold voltage in a single cell. The cell structure, described with reference to FIG. 29, is equivalent to that shown in literature 1.

When left under conditions of a drain voltage Vd of 5 V and a control gate voltage Vcg of 0 V (Vs=Vsub=GND), the cell (white circles in FIG. 30) overerased to the threshold voltage Vth of about 0 V is written back to a convergence threshold voltage Vthc of up to 1.75 V after about 0.1 sec. Current sensitivity of a sense amplifier is set to 30 $\mu$A.

This write-back method requires no bit selection dissimilarly to the method in the CHE mode but the cell may be left while applying the drain voltage to bit lines of the overall array while setting a gate potential (word line potential) to 0 V.

Further, the feature of this method resides in that, also in a memory cell (shown by white triangles (erect) in FIG. 30) whose threshold voltage Vth is higher than the convergence threshold voltage Vthc, the threshold voltage Vth fluctuates to the convergence threshold voltage Vthc.

In a cell whose threshold voltage Vth is lower than the convergence threshold voltage Vthc, injection (electron injection) of DAHE shown in FIG. 28 takes place to reduce the floating gate potential to a level Vg* in FIG. 28. Consequently, the threshold voltage Vth of the cell is written back to the convergence threshold voltage Vthc.

In the cell whose threshold voltage Vth is higher than the convergence threshold voltage Vthc, injection (hole injection) of DAHH shown in FIG. 28 takes place to increase the floating gate potential to the level Vg* in FIG. 28. Consequently, it follows that the threshold voltage Vth of the cell is reduced to the convergence threshold voltage Vthc.

That is, electron injection with DAHE and hole injection with DAHH are balanced at the convergence threshold voltage Vthc. In other words, both of electrons and holes are continuously injected into the floating gate of the memory cell whose control gate potential reaches Vg* in a balanced manner.

FIG. 31 shows drain voltage dependency in the overerased bit write-back method with DAHE/DAHH. The time required for write-back is increased as the drain voltage Vd is reduced from 6 V to 4 V.

FIG. 32 shows gate voltage-to-drain current characteristics (Vg–Id characteristics) in the cell reaching the convergence threshold voltage Vthc in the overerased bit write-back method with DAHE/DAHH.

Referring to FIG. 32, it is understood that a current flows in the written-back cell also when the gate potential Vg is 0 V. This measurement is made under the drain voltage Vd of 1 V, and a current of several $\mu$A/bit flows in actual write-back with application of the drain voltage Vd of 5 V. This also applies to write-back conditions of 1 sec. with Vd of 4 V and 1 sec. with Vd of 6 V.

When the overall array is selected in place of bit line selection in the overerased bit write-back method with DAHE/DAHH, it follows that a current of about 500 mA flows per block even if the array block size is 256 bits (per bit line)×2048 bits (per word line)=512 Kbits and a cell current at the convergence threshold voltage Vthc is 1 $\mu$A/bit.

In other words, the driving current is disadvantageously increased in the write-back operation in this method.

Referring to the aforementioned literature 3, it is also reported that channel conductance is deteriorated in write-back with the DAHE/DAHH gate current.

This is because both of electrons and holes are continuously injected into the floating gate through the oxide film at the convergence threshold voltage Vthc, to result in deterioration of the gate oxide film.

(2-2-2) Write-Back with Subthreshold CHE

The inventors have proposed a write-back method with subthreshold CHE as a method of self-selectively writing back an overerased cell on a selected bit line while setting a word line in a non-selected state.

FIG. 33 is a conceptual diagram showing the structure of a section of a drain part of a memory cell transistor subjected to such write-back.

As described later in detail, a floating gate 4 is provided on a $P^+$ region of the main surface of a P-type substrate through a gate oxide film. An $N^{++}$ drain region 2b for field relaxation is provided between an N⁺ drain region $2bb$ and the floating gate 4, dissimilarly to the structure shown in FIG. 27.

When further increasing CHE write efficiency through the structure shown in FIG. 33, CHE writing at a lower drain voltage is enabled.

It has been found that, in this case, a channel current is energetically accelerated in a high field region close to a drain at a drain voltage lower than that in the conventional write-back with DAHE/DAHH, the channel current flowing in a threshold region is consequently energetically accelerated in the high field region close to the drain as compared with a gate current Ig component generated by injection of part of secondarily generated DAHE/DAHH into a gate oxide film and a gate current generated by CHE components resulting from injection of part of the channel current into the gate oxide film becomes larger.

FIG. 34 shows dependency of the gate current Ig on the gate voltage Vg under such operating conditions enabling write-back with subthreshold CHE.

FIG. 34 also shows the characteristics shown in FIG. 28 for the purpose of comparison.

The difference between this method and the conventional self-selective write-back with DAHE/DAHH shown in FIG. 28 resides in that only electrons are injected in the write-back with subthreshold CHE.

This is clearly understood by observing the Vg–Id characteristics after convergence.

In the self-selective write-back with DAHE/DAHH, the threshold voltage Vth converges to the level where electrons and holes are balanced. As shown in FIG. 32, therefore, the channel current flows in the Vg–Id characteristics of the memory cell after convergence also when the control gate potential Vcg is 0 V. In other words, the memory cell transistor is not cut off also when Vcg=0 V.

FIG. 35 shows gate voltage-to-drain current characteristics (Vg–Id characteristics) of a cell reaching the convergence threshold voltage Vthc in the overerased bit write-back method with subthreshold CHE.

Referring to FIG. 35, white circles show initial characteristics, white triangles (erect) show characteristics after performing write-back with subthreshold CHE for 1 msec. under conditions of the drain voltage of 4 V and Vcg=0 V, and inverted triangles show characteristics after performing write-back with subthreshold CHE for 1 sec. respectively.

In the overerased bit write-back with subthreshold CHE, a channel current slightly flowing when the control gate potential Vcg is 0 V is injected into a gate and hence the channel current is cut off in the Vg–Id characteristics of the memory cell after convergence.

In the self-selective write-back with subthreshold CHE, therefore, the threshold voltage Vth does not fluctuate in a cell whose threshold Vth is higher than the convergence threshold voltage Vthc, i.e., in which the channel current is cut off, while the threshold voltage Vth is increased only in a cell whose threshold voltage Vth is lower than the convergence threshold voltage Vthc, i.e., in which the channel current is not cut off.

FIG. 36 shows initial threshold dependency of time fluctuation of thresholds of cells subjected to write-back with subthreshold CHE.

It is understood that the threshold voltage Vth is increased only in the cell in which the channel current is not cut off as described above.

FIG. 37 is a diagram for illustrating convergence times of thresholds in the case of performing write-back with subthreshold CHE.

As to memory cell transistors having initial thresholds of 0 V and 1 V, it is understood that the thresholds approximate to a convergence value after a lapse of about 10 msec. under conditions of the drain voltage Vd of 4 V and Vcg=0 V.

FIG. 38 is a diagram for illustrating applied drain voltage dependency of convergence of thresholds in the write-back with subthreshold CHE.

FIG. 39 is a diagram for illustrating applied drain voltage dependency of convergence of thresholds in the case of performing write-back with subthreshold CHE in a drain voltage region lower than that shown in FIG. 38.

FIG. 40 illustrates distribution of threshold voltages after performing write-back with subthreshold CHE on a 256 K-bit array.

Referring to FIG. 40, white circles show characteristics after an erase operation, and white triangles (erect) show characteristics after a lapse of 50 msec. under conditions of the drain voltage Vd of 4.5 V and the control gate voltage Vcg of 0 V.

In such a self-selective write-back method with subthreshold CHE, only electrons are injected to cause no deterioration of channel conductance dissimilarly to the write-back with DAHE/DAHH.

The characteristics of the aforementioned write-back methods are summarized as follows:

I) Write-back method in CHE Mode

In this case, a potential different from that in a write operation for a cell is disadvantageously required, with requirement for bit selection of an overerased cell.

Further, a driving current in write-back is problematically large. This results from the mode of injecting CHE generated by positively feeding a channel current into a floating gate.

II) Self-Selective Write-back with DAHE/DAHH Gate Current

In this case, no bit selection is required but write-back can advantageously be made in a self-selective manner. Further, the generated potential may be set substantially identically to that in writing.

When voltage reduction takes place, however, the time required for convergence is disadvantageously increased. For example, a time of about 0.1 sec. to 1 sec. may be required. Further, Further a driving current in write-back must disadvantageously be large. This results from a convergence current flowing in the overall array. In addition, channel conductance of the cell is deteriorated due to simultaneous injection of electrons and holes.

III) Self-Selective Write-back with Subthreshold CHE Gate Current

No bit selection is required but write-back can advantageously be made in a self-convergent manner. Further, the generated potential may be set substantially identically to that in writing.

When voltage reduction takes place, however, the time required for convergence is disadvantageously increased, similarly to the self-selective write-back with the DAHE/DAHH gate current.

In this case, the time required for write-back is typically about 100 msec.

There is such a tendency that the channel current is cut off as the write-back progresses and hence the driving current is reduced, while only electrons are injected and hence the channel conductance is not deteriorated.

Comparing the aforementioned three methods with each other, at least the self-convergent (self-selective) write-back method is advantageous for cost reduction since the circuit scale required for bit specification of an overerased cell is reduced.

However, the self-selective write-back in the subthreshold CHE mode or the DAHE/DAHH mode also has the following problem:

In recent years, requirement for a flash memory having a single power source is increased and a potential to bit lines must be driven with a charge pump circuit CP.

In this case, no write-back is performed in the self-selective write-back method unless sufficient attention is paid to off-state leakage of the memory cells.

FIG. 41 is a flow chart for illustrating an erase sequence in self-selective write-back.

When the erase sequence of the conventional self-selective write-back is started (step S100), a pre-erase write operation (step S104) is performed and thereafter application of an erase pulse (step S106) and an erase verify operation (step S108) are repeated until the threshold voltage Vth of a bit having the highest threshold is reduced below an erase verify level in post-erase threshold voltage Vth distribution.

After completion of the erase operation, a write-back pulse is added for self-selectively writing back an over-erased bit present on a bit line supplied with a bit line potential (step S110).

In this method, however, write-back may not function unless design is made with sufficient attention paid to sense current sensitivity and the size of the array subjected to collective write-back.

FIG. 42 illustrates gate potential-to-drain current characteristics (Vg-Id characteristics) of an erased unit cell.

In the circuit of the flash memory, the threshold voltage Vth is defined in the value of the gate potential Vg when a cell current value reaches a certain standard value.

Assuming that the cell current standard value is 30 $\mu$m in a single end sense amplifier, the post-erase threshold voltage Vth of the cell shown in FIG. 42 is 2.4 V.

It is to be noted that an off-state leakage current (hereinafter denoted by Ioff) of up to about several nA flows in this cell also when the gate potential Vg is 0 V.

In the write-back operation (typically under operating conditions of the drain voltage Vd of 5 V and the gate potential Vg of 0 V) employing the self-selective write-back method, therefore, it follows that a small off-state leakage current flows even in a non-overerased cell having a threshold voltage Vth of 2.4 V.

In other words, unignorable off-state leakage Ioff is present depending on post-erase threshold voltage Vth distribution in the write-back operation also when performing self-convergent write-back with subthreshold CHE in the conventional erase method performing write-back after erase verification. In other words, it follows that such off-state leakage Ioff flows also when the word line potential is 0 V since not all cells are cut off.

It is important to take such an off-state leakage value into consideration in order to effectuate write-back. The problem of the off-state leakage current value is now described in more detail with reference to examples.

FIG. 43 illustrates distribution of post-erase threshold voltages Vth. Referring to FIG. 43, white circles show measured values, while black circles, black triangles (erect), black squares and black triangles (inverted) show Gaussian distribution with thresholds of 2.4 V, 2 V, 1.6 V and 1.2 V respectively. It is understood that the distribution of the threshold voltages Vth can be substantially approximated with Gaussian distribution except behavior of tail bits (bits on the bottoms of the distribution).

FIG. 44 shows calculated sums of off-state leakage in the erase threshold Vth distribution (distribution as to 1-Mbit memory cells). The off-state leakage values vary with the positions of the erase threshold Vth distribution.

Referring to FIG. 44, the sums of bit off-state leakage located on the respective thresholds Vth are shown on the vertical axis in the erase threshold Vth distribution. The off-state leakage values are increased as the erase threshold Vth distribution is shifted to the lower Vth side.

FIG. 45 shows the sum of off-state leakage in the overall post-erase threshold voltage Vth distribution of a 64-KB (512-Kbit) block in the case of defining the threshold voltage Vth with the sense current sensitivity of 30 $\mu$A. Referring to FIG. 45, the total of the threshold voltages Vth in FIG. 44 is shown on the vertical axis.

When calculating the sum of the in-block off-state leakage in FIG. 45, the erase threshold Vth distribution is approximated to Gaussian distribution and the horizontal axis shows peak positions of the erase threshold Vth distribution.

In the case of a peak value Vth.peak (2.5 V) in the threshold distribution, the sum of the off-state leakage reaches 4 mA, which is too large for a general circuit structure as described below.

In general, an external single power source is required as the product standard of a flash memory, as described above. Therefore, the charge pump circuit CP is employed for driving the bit line current in the write operation. The upper limit of charge pump driving is about several mA in current value, depending on the mode and the area of the charge pump.

When the current value exceeds the upper limit, no desired voltage can be extracted from the charge pump but its output voltage is reduced. Also in the write-back operation, the charge pump circuit CP applies a voltage to the bit line.

In general, an erase verify value of the erase threshold Vth, i.e., the value of a bit having the highest threshold Vth in the erase threshold Vth distribution is set to about 3.5 V. Spreading of the erase threshold Vth distribution is up to about 1 V in half breadth (refer to FIG. 43), and hence the peak value Vth.peak of the erase threshold distribution can be about 2.5 V.

In other words, the sum of the off-state leakage of the erase threshold Vth distribution already reaches a value of about the upper limit of the driving current of the charge pump in a state performing general erasing, as shown in FIG. 45.

The voltage drivable by the charge pump is extremely reduced when exceeding the upper limit of the driving current. On the other hand, the write-back characteristics with subthreshold CHE are remarkably slowed when the bit line voltage is reduced, as shown in FIGS. 38 and 39.

When the sum of the off-state leakage of the erase threshold Vth distribution already reaches a value of about the upper limit of the driving current of the charge pump in the aforementioned state of performing general erasing, therefore, the voltage driven by the bit line may be reduced to result insufficient function of write-back, i.e., overerasing may be unrepairable.

Thus, it is problematic in a self-selective write-back operation that the bit line potential is reduced due to the sum of off-state leakage of the erase threshold Vth to result in ineffective write-back.

SUMMARY OF THE INVENTION

An object of the present invention is to provide a nonvolatile semiconductor memory device performing self-selective write-back after completion of erase verification, which can suppress reduction of a bit line potential in the write-back with an off-state leakage current.

Briefly stated, the present invention is directed to a nonvolatile semiconductor memory device formed on a semiconductor substrate, which comprises an internal power supply circuit, a control circuit, a memory cell array, a reference potential generation circuit, a cell potential supply circuit and a sense amplifier part.

The internal power supply circuit receives an external power supply potential and generates an internal power supply potential. The control circuit controls an operation of the nonvolatile semiconductor memory device in response to a command signal.

The memory cell array has a plurality of floating-gate memory cell transistors arranged in rows and columns. The memory cell array is divided into a plurality of memory cell blocks forming units subjected to an erase operation by repeating collective application of an erase pulse to the memory cell transistors and an erase verify operation respectively.

The reference potential generation circuit generates a reference potential for threshold determination of the memory cell transistors.

The cell potential supply circuit selects a memory cell transistor for selectively supplying the reference potential to the selected memory cell transistor in the erase verify operation and selectively supplying the internal power supply potential to the selected memory cell transistor in a write-back operation performed after completion of the erase verify operation respectively.

The sense amplifier part includes a plurality of sense amplifiers for reading data from the selected memory cell transistor and performing threshold determination on the basis of the value of a current flowing through the selected memory cell transistor in the write-back operation.

Current sensitivity of the sense amplifiers in the threshold determination is so set that the sum of leakage currents in off states of a plurality of memory cell transistors collectively subjected to the write-back operation is within the range of current drivability of the internal power supply circuit after completion of the erase verify operation.

According to another aspect of the present invention, a nonvolatile semiconductor memory device formed on a semiconductor substrate comprises an internal power supply circuit, a control circuit, a memory cell array, a reference potential generation circuit, a cell potential supply circuit and a sense amplifier part.

The internal power supply circuit receives an external power supply potential and generates an internal power supply potential. The control circuit controls an operation of the nonvolatile semiconductor memory device in response to a command signal.

The memory cell array has a plurality of floating-gate memory cell transistors arranged in rows and columns. The memory cell array is divided into a plurality of memory cell blocks forming units subjected to an erase operation by repeating collective erase pulse application to the memory cell transistors and an erase verify operation respectively.

The reference potential generation circuit generates a reference potential for threshold determination of the memory cell transistors.

The cell potential supply circuit selects a memory cell transistor for selectively supplying the reference potential to the selected memory cell transistor in the erase verify operation and selectively supplying the internal power supply potential to the selected memory cell transistor in a write-back operation performed after completion of the erase verify operation respectively.

The sense amplifier part includes a plurality of sense amplifiers for reading data from the selected memory cell transistor and performing threshold determination on the basis of the value of a current flowing through the selected memory cell transistor in the write-back operation.

The reference potential is so set that the sum of leakage currents in off states of a plurality of memory cell transistors collectively subjected to the write-back operation is within the range of current drivability of the internal power supply circuit after completion of the erase verify operation.

According to still another aspect of the present invention, a nonvolatile semiconductor memory device formed on a semiconductor substrate comprises an internal power supply circuit, a control circuit, a memory cell array, a reference potential generation circuit, a cell potential supply circuit and a sense amplifier part.

The internal power supply circuit receives an external power supply potential and generates an internal power supply potential. The control circuit controls an operation of the nonvolatile semiconductor memory device in response to a command signal.

The memory cell array has a plurality of floating-gate memory cell transistors arranged in rows and columns. The memory cell array is divided into a plurality of memory cell blocks forming units subjected to an erase operation by repeating collective erase pulse application to the memory cell transistors and an erase verify operation.

The reference potential generation circuit generates a reference potential for threshold determination of the memory cell transistors.

The cell potential supply circuit selects a memory cell transistor for selectively supplying the reference potential to the selected memory cell transistor in the erase verify operation and selectively supplying the internal power supply potential to the selected memory cell transistor in a write-back operation respectively.

The sense amplifier part includes a plurality of sense amplifiers for reading data from the selected memory cell transistor and performing threshold determination on the basis of the value of a current flowing through the selected memory cell transistor in the write-back operation.

The control circuit collectively performs the write-back operation in units of the memory cell transistors of a number smaller than the number of the memory cell transistors included in the memory cell blocks.

According to a further aspect of the present invention,-an erase method for a nonvolatile semiconductor memory device comprises steps of repeating a collective erase operation for a memory cell block including a plurality of memory cell transistors and an erase verify operation until the thresholds of the memory cell transistors fall below a prescribed verify level and bringing a word line into a non-selected state and collectively performing a self-selective write-back operation for a memory cell in an overerased state on a selected bit line with respect to subblocks each including memory cell transistors of a bit number less than the bit number of the memory cell block after completion of the erase verify operation.

According to a further aspect of the present invention, an erase method for a nonvolatile semiconductor memory device comprises steps of performing a collective erase operation for a memory cell block including a plurality of memory cell transistors, bringing a word line into a non-selected state and collectively performing a self-selective write-back operation for a memory cell in an overerased state on a selected bit line with respect to a plurality of memory cell transistors and repeating the erase operation and the write-back operation until the thresholds of the memory cell transistors fall below a prescribed verify level.

According to a further aspect of the present invention, an erase method for a nonvolatile semiconductor memory device comprises steps of repeating a collective erase operation on a memory cell block until the threshold of a memory cell transistor in the memory cell block falls below a first prescribed verify level, performing a collective erase operation on the memory cell block after the threshold of the memory cell transistor in the memory cell block falls below the first prescribed verify level, bringing a word line into a non-selected state and collectively performing a self-selective write-back operation for a memory cell in an overerased state on a selected bit line with respect to a plurality of memory cell transistors and repeating the erase operation and the write-back operation until the thresholds of the memory cell transistors fall below a second prescribed verify level lower than the first prescribed verify level.

According to a further aspect of the present invention, an erase method for a nonvolatile semiconductor memory device comprises steps of performing a collective erase operation on a memory cell block including a plurality of memory cell transistors, determining whether or not the sum of leakage currents in off states is in excess of a prescribed value as to a plurality of memory cell transistors, bringing a word line into a non-selected state and collectively performing a self-selective write-back operation for a memory cell in an overerased state on a selected bit line with respect to a plurality of memory cell transistors when the sum of the leakage currents is in excess of the prescribed value and repeating the erase operation, the determination and the write-back operation until the thresholds of the memory cell transistors fall below a prescribed verify level.

Thus, a principal advantage of the present invention resides in that a write-back operation can be reliably performed while suppressing increase of an off-state leakage current generated by setting post-erase threshold Vth distribution.

Another advantage of the present invention resides in that it is possible to reliably perform a write-back operation while suppressing increase of an off-state leakage current generated by setting post-erase threshold Vth distribution. Further, a potential is supplied to a bit line of a cell array while setting a word line in a non-selected state and an overerased cell present on the bit line supplied with the potential can be self-selectively reliably written back.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A to 4D are step diagrams showing a procedure of manufacturing a memory cell transistor shown in FIG. 2;

DESCRIPTION OF THE PREFERRED EMBODIMENTS

Structure of Nonvolatile Semiconductor Memory Device

Figure 1:
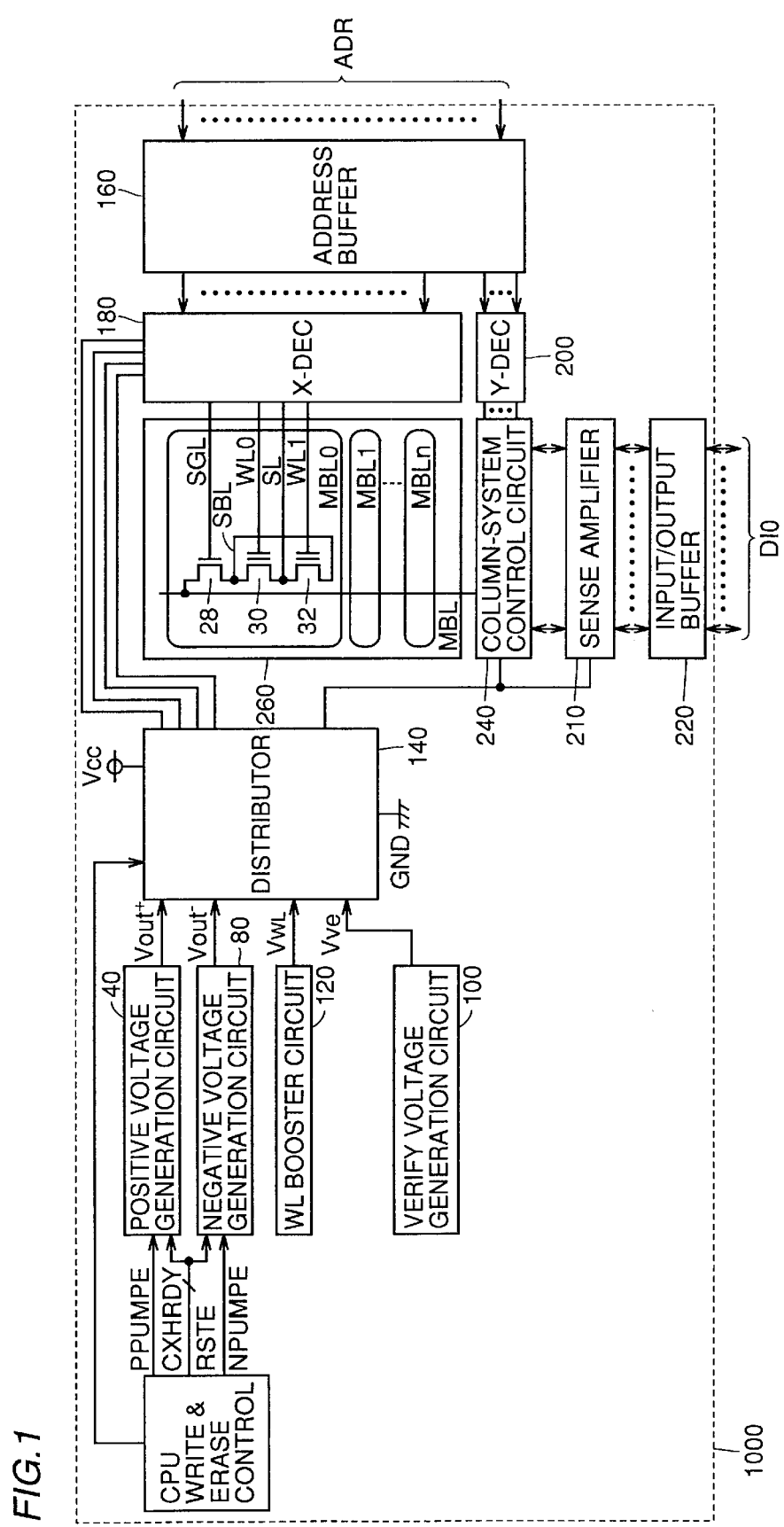
FIG. 1 is a schematic block diagram showing the structure of a nonvolatile semiconductor memory device 1000 according to the present invention.

FIG. 1 is a schematic block diagram showing the structure of a nonvolatile semiconductor memory device 1000 according to the present invention.

Referring to FIG. 1, the semiconductor memory device 1000 includes a CPU 20 employing a ROM therein for controlling writing and erasing on the basis of a program code held in this ROM and an externally supplied command signal, a positive voltage generation circuit 40 controlled by the CPU 20 for generating an output potential Vout+, a negative voltage generation circuit 80 controlled by the CPU 20 for generating an output potential Vout−, a verify voltage generation circuit 100 generating a verify voltage Vve supplied to a word line in a verify operation, a word line booster circuit 120 generating a word line driving potential $V_{WL}$, and a distributor 140 controlled by the CPU 20 for receiving the output potentials Vout+ and Vout− and the potential $V_{WL}$ and distributing these potentials to each internal circuit.

The positive voltage generation circuit 40 and the negative voltage generation circuit 80 include charge pump circuits receiving a ground potential GND and an external power supply potential Vcc to operate.

The semiconductor memory device 1000 further includes a memory cell array 260. The memory cell array 260 includes memory blocks MBL0 to MBLn formed in isolated wells respectively. Erase operations of the nonvolatile semiconductor memory device 1000 are performed in units of the memory blocks MBL0 to MBLn.

The memory block MBL0 includes memory cells 30 and 32 and a selection gate 28. In the memory block MBL0, a memory cell corresponding to a selection gate line SGL, word lines WL0 and WL1 and a source line SL selected by an X decoder 180 is selected. In a write operation, the selected memory cell receives a signal corresponding to data from a main bit line MBL through the selection gate 28 and a subbit line SBL and holds the data.

FIG. 1 representatively illustrates the memory cells 30 and 32 and the selection gate 28 corresponding to the selected selection gate line SGL, word lines WL0 and WL1 and source line SL.

The memory cell array 260 shown in FIG. 1 has the so-called DINOR memory cell array structure having bit lines hierarchized into the main bit line MBL and the subbit line SBL.

The semiconductor memory device 1000 further includes an address buffer 160 receiving an address signal ADR, the X decoder 180 receiving the address signal from the address buffer and supplied with the potentials from the distributor for deciding the potentials of the selection gate SGL, the word lines WL0 and WL1, the source line SL and the well, an input/output buffer 220 for transmitting/receiving a data input/output signal DIO, a Y decoder 200 receiving and decoding the address signal from the address buffer 160, a sense amplifier zone 210 including a plurality of sense amplifiers reading data in a read operation for performing threshold determination of a selected memory cell transistor in a verify operation, and a column-system control circuit 240 applying a high voltage to the main bit line MBL in correspondence to the data input/output signal in response to an output of the Y decoder 200 while performing column selection in a read operation for selectively connecting the main bit line MBL with the sense amplifiers.

The X decoder includes a WL decoder for selecting a word line, an SG decoder for selecting a selector gate, a WELL decoder selecting a well region corresponding to a selected memory block and an SL decoder for selecting a source line, although these elements are not shown in FIG. 1.

The YK control circuit 240 includes a page buffer having a latch circuit and deciding whether or not to apply the high voltage to the main bit line MBL in writing on the basis of latched data.

The WL booster circuit 120 generates a frequency potential supplied to the selected word line WL and the selected selection gate SG in reading for implementing high-speed access.

While the memory cell array has a DINOR structure for convenience in the above description, the present invention is not restricted to this but is also preferably applicable to a nonvolatile semiconductor memory device having the so-called NOR memory cell array, for example, and is more generally applicable to a nonvolatile semiconductor device formed by memory cell transistors having a floating-gate structure, as clarified in the following description.

It is assumed that the memory cell transistors 30, 32 etc. shown in FIG. 1 have a structure capable of the aforementioned subthreshold CHE write-back. The structure thereof and a method of manufacturing the same are now briefly described.

Figure 2:
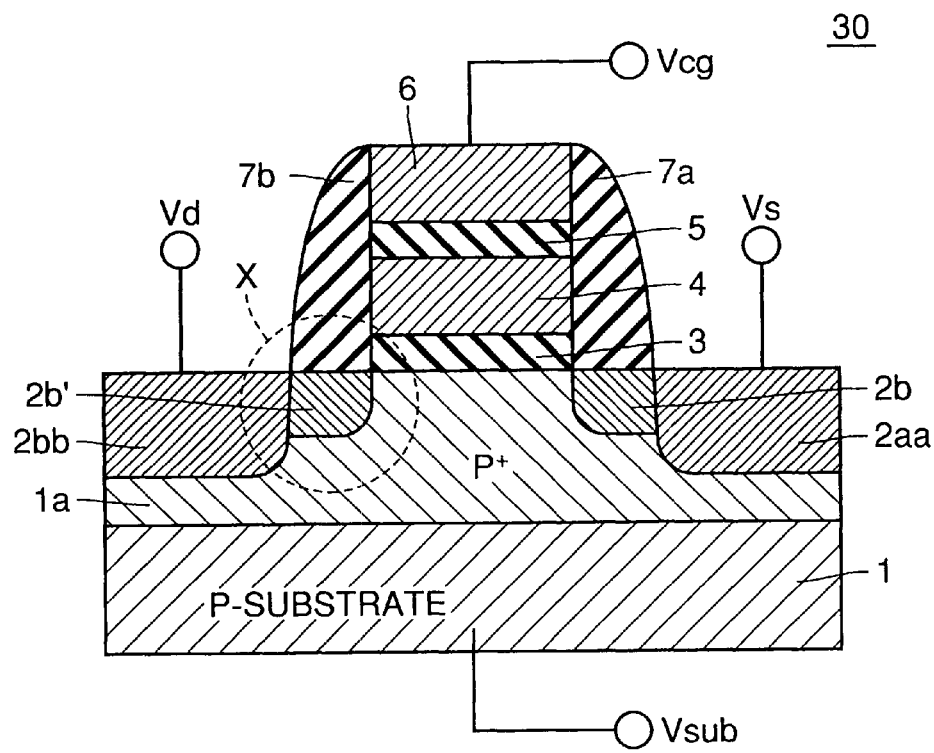
FIG. 2 is a schematic sectional view showing the structure of a memory cell 30 shown in FIG. 1.

FIG. 2 is a schematic sectional view showing the structure of the memory cell 30 shown in FIG. 1.

Figure 3:
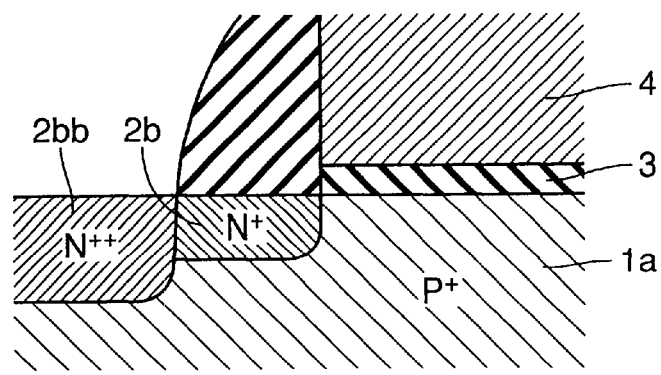
FIG. 3 is a sectional view showing a part enclosed with a dotted circle X in FIG. 2 in an enlarged manner.

FIG. 3 is a sectional view showing a part enclosed with a dotted circle X in FIG. 2 in an enlarged manner.

FIG. 3 shows an impurity profile in the cell structure of the cell transistor in the vicinity of a drain.

FIGS. 4A to 4D are step diagrams showing the procedure of manufacturing the memory cell transistor shown in FIG. 2.

Referring to FIGS. 2 and 3, a high-concentration P-type region, i.e., a $P^+$ region (first conductivity type region) 1a is provided on the main surface of the P-type semiconductor substrate (semiconductor substrate) 1. A first gate insulating film (gate insulating film) 3, a floating gate 4 made of polycrystalline silicon or the like, a second gate insulating film 5 having a three-layer structure, referred to as an ONO structure, of an oxide film, a nitride film and an oxide film for preventing leakage and a control gate 6 made of polycrystalline silicon or the like are stacked on the $P^+$ region 1a and thereafter worked into gate shapes. Side walls 7a and 7b, which are insulating films, are provided on source and drain sides respectively. The floating gate 4, the second gate insulating film 5 and the control gate 6 form a two-layer gate electrode.

High-concentration N-type regions, i.e., $N^+$ regions 2b and 2b' are provided in proximity to the two-layer gate electrode. The $N^+$ region 2b' serves as a field relaxation layer, and N-type source and drain regions of higher concentrations, i.e., $N^{++}$ source and drain regions 2aa and 2bb are provided through the side walls serving as spacers.

The method of manufacturing the memory cell transistor 30 is now described with reference to FIGS. 4A to 4D.

Figure 4A:

First, channel doping is performed by ion-implanting boron (B) or the like so that the P concentration on the surface layer of the P-type semiconductor substrate 1 is about $1 \times 10^{18}$ cm$^{-3}$ as shown in FIG. 4A, in order to form the structure of a channel region, i.e., the $P^+$ region 1a. The implanted boron spreads in the P-type semiconductor substrate 1 up to a depth of about 0.4 μm from its surface by heat treatment depending on the heat treatment conditions after doping. More specifically, the $P^+$ region 1a exhibits a P concentration of $4 \times 10^{13}/0.4$ μm=$1 \times 10^{18}$ cm$^{-3}$ when boron is implanted by at least $4 \times 10^{13}$ cm$^{-2}$.

Figure 4B:
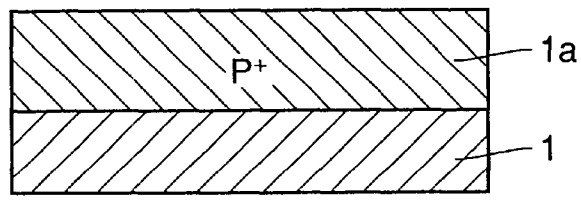
Figure 4C:
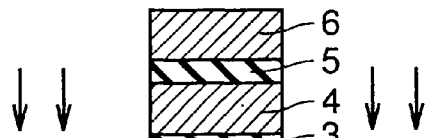
Figure 4C:
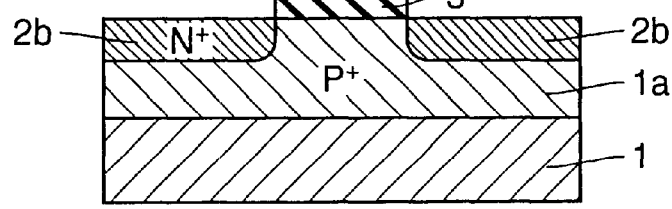
Figure 4C:
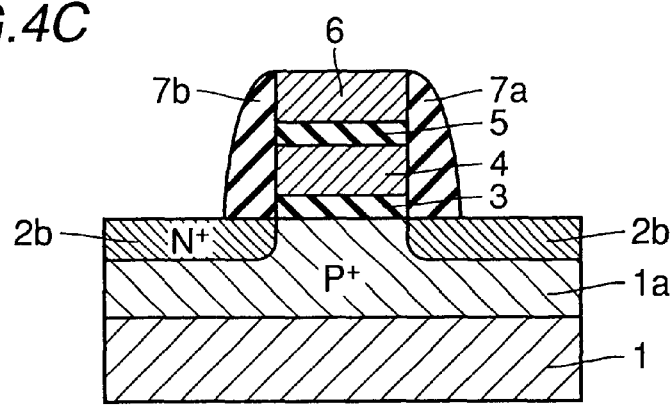
Figure 4C:
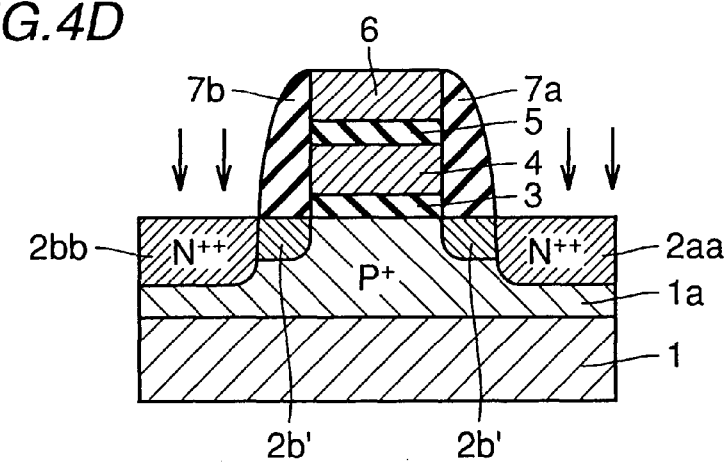

Then, the floating gate 4 is formed on the P-type semiconductor substrate 1 through the first gate insulating film 3 and the control gate 6 is formed through the second gate insulating film 5, for thereafter completing the two-layer electrode, as shown in FIG. 4B. When ion-implanting arsenic (As) or the like through the two-layer electrode serving as a mask for forming the $N^+$ drain region 2b and performing heat treatment in order to form a cell drain structure, the $N^+$ drain region 2b spreads up to a depth of about 0.2 μm from the surface layer.

When implanting arsenic (As) or the like by not more than $1 \times 10^{15}$ cm$^{-2}$ before forming the side walls 7a and 7b in the next step (refer to FIG. 4B), for example, the $N^+$ drain region 2b exhibits a P concentration of about $5 \times 10^{19}$ cm$^{-3}$.

Then, an insulating film of a prescribed thickness is formed on the upper surfaces of the aforementioned elements, and this oxide film is totally anisotropically etched for forming the side walls 7a and 7b on the side surfaces of the gate electrode. As or the like is ion-implanted into this surface structure in a high concentration as shown in FIG. 4D, thereby obtaining the $N^{++}$ source and drain regions 2aa and 2bb of higher concentrations as well as the $N^+$ drain region 2b' serving as a field relaxation layer through the two-layer electrode and the side walls serving as masks.

Thereafter an interlayer isolation film (not shown) is formed on the overall surface and partially opened to reach the portions of the P-type semiconductor substrate 1 provided with the $N^{++}$ source and drain regions 2aa and 2bb for forming a contact hole. Further, a metal film of aluminum or the like is formed by vapor deposition, sputtering or chemical vapor deposition and patterned with resist or the like for forming a source electrode Vs and a drain electrode Vd, thereby completing the cell structure of the inventive nonvolatile semiconductor memory device (e.g., a flash memory).

Characteristic parts in the cell structure of this flash memory are further described.

In relation to the impurity profile shown in FIGS. 2 and 3, it is generally known that an LDD (lightly doped drain) structure may be employed in order to suppress hot carrier deterioration (generation of a drain avalanche current) of transistors. In the nonvolatile semiconductor memory device 1000 shown in FIG. 1, therefore, the $N^+$ drain region 2b' is formed by reducing the concentration of an $N^+$ diffusion layer in the vicinity of a portion of the $N^+$ drain region 2b in contact with the $P^+$ region 1a in a memory cell (hereinafter simply referred to as a cell) of the flash memory subjected to electron writing with CHE for suppressing generation of drain avalanche current while increasing the concentration of the $P^+$ region 1a adjacent thereto for improving CHE efficiency.

Figure 5:
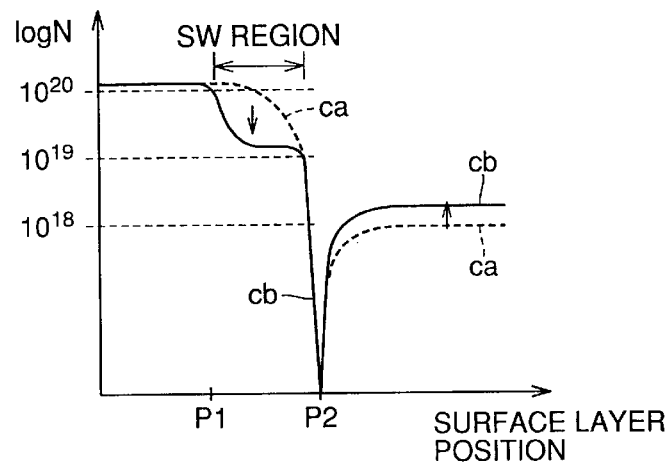
FIG. 5 is a graph showing impurity distribution on a channel surface in the vicinity of a drain end of a cell structure.

For example, FIG. 5 is a graph showing impurity concentration on a channel surface in the vicinity of a drain end of the inventive cell structure in comparison with the conventional cell structure. Referring to FIG. 5, a curve ca shows the conventional cell structure and a curve cb shows the inventive cell structure, while a surface layer position between P1 and P2 corresponds to a portion located under the side wall 7b (SW region). In this case, the $N^+$ drain region 2b was formed while suppressing the injection rate so that the concentration of arsenic (As) was less than about $1 \times 10^{15}$ cm$^{-2}$. Consequently, the concentration of the $N^+$ drain region 2b located under the side wall 7b was reduced as compared with $1 \times 10^{20}$ cm$^{-3}$, the value in the conventional case, while the level of at least $1 \times 10^{19}$ cm$^{-3}$ was ensured.

Such inconvenience that an electric field is relaxed in the vicinity of the drain to reduce CHE efficiency due to reduction of the $N^+$ concentration of the $N^+$ drain region 2b was avoided by setting the concentration of the $P^+$ region 1a higher (at least $1 \times 10^{18}$ cm$^{-3}$) than the conventional value of not more than $1 \times 10^{18}$ cm$^{-3}$.

Further, the cell structure of the NOR flash memory was so set that the concentration of the $P^+$ region 1a adjacent in the vicinity of the drain was at least $1 \times 10^{18}$ cm$^3$ and the concentration of the $N^+$ drain region 2b adjacent to the $P^+$ region 1a was not more than $1 \times 10^{20}$ cm$^{-3}$. Consequently, a characteristic of cutting off a channel current with convergence Vthc.

Write-back Operation of First Embodiment

Operations of the aforementioned cell structure are now described.

Writing in the cell is performed in the CHE mode by injecting high-energy electrons accelerated beyond the barrier height of the first gate insulating film 3 among channel electrons accelerated by a steep electric field in the vicinity of the drain into the floating gate 4. Write-back of the cell is performed by supplying the same drain voltage Vd as that in writing to the bit lines of the overall array while holding a gate potential Vcg at a GND level (0 V) (Vs=Vsub=GND), for example.

Consequently, the overerased cell can be written back in a self-convergent manner to cut off the channel current in convergence. It is also possible to improve write efficiency of CHE by applying a back gate potential (negative bias) to the substrate (Vs=GND, Vsub<0V).

The memory cell transistor shown in FIG. 2 has the aforementioned structure, whereby the threshold Vth of the cell lower than the convergence Vthc can be selectively written back to the convergence Vthc at a high speed without supplying a potential to all bit lines of the cell array and selecting the overerased cell while holding all control gates at the GND level dissimilarly to the prior art. Further, a cell current is cut off in the convergence Vthc state, whereby current consumption can be suppressed as Vth converges.

A first embodiment of the present invention is characterized in that the current sensitivity of a sense current amplifier defining the threshold voltage Vth of a memory cell is decided in view of off-state leakage in a nonvolatile semiconductor memory device having the structure of the nonvolatile semiconductor memory device 1000, selecting a bit line in a non-selected state of a word line, self-selectively writing back only an overerased cell on the selected bit line and performing the aforementioned write-back operation after completion of erase verification, as described below.

Figure 42:
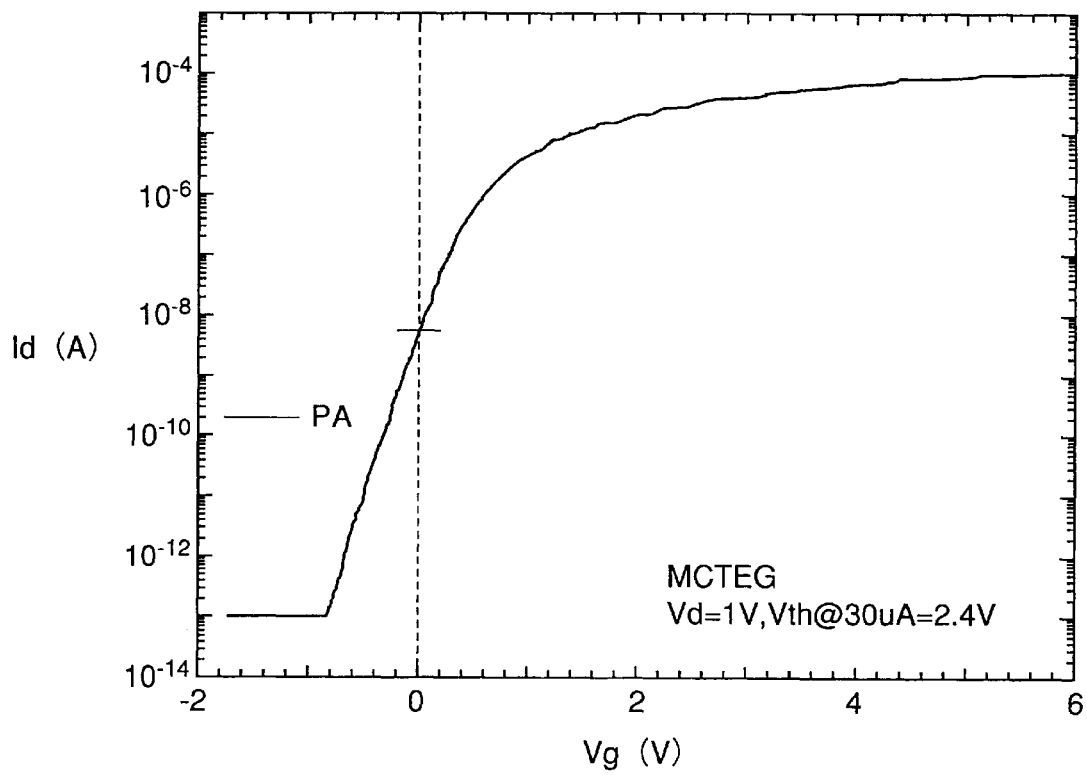
FIG. 42 illustrates gate potential-to-drain current characteristics (Vg–Id characteristics) of an erased unit cell.
Figure 43:
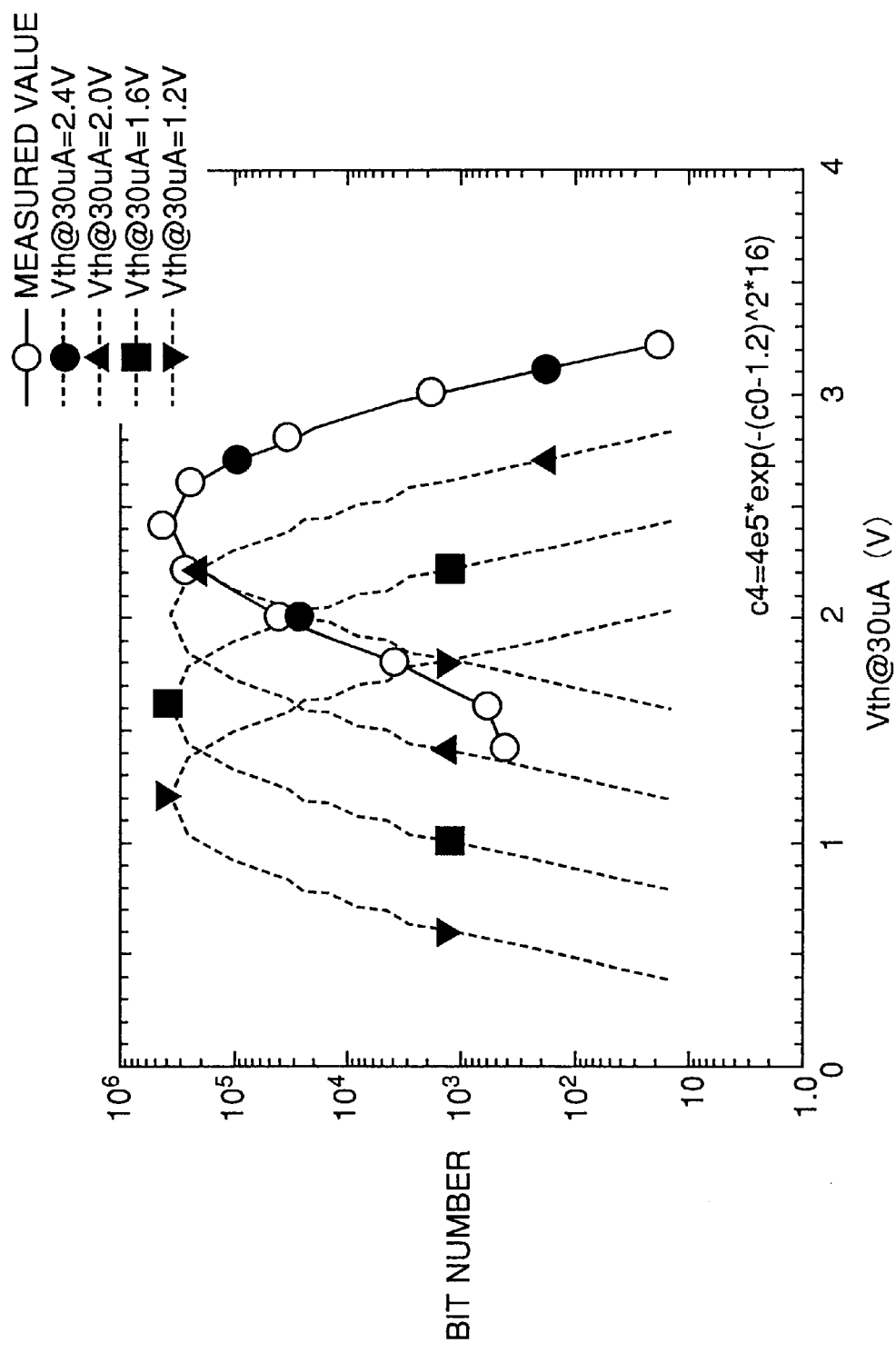
FIG. 43 illustrates post-erase threshold voltage Vth distribution.
Figure 44:
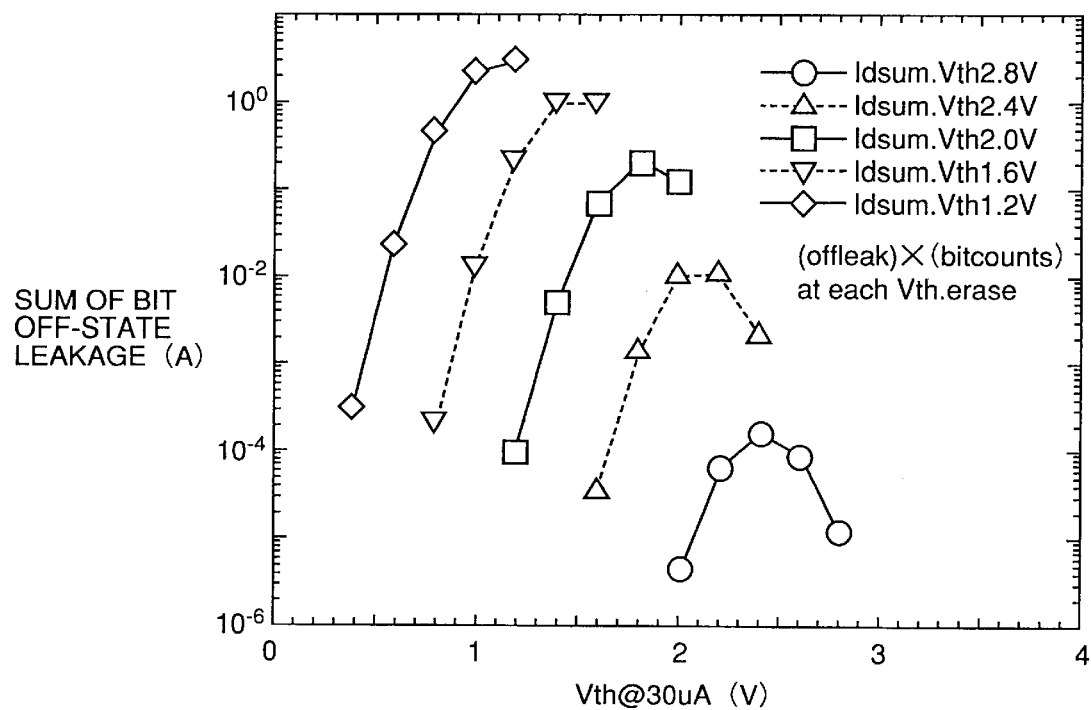
FIG. 44 illustrates a result of calculation of the sum of off-state leakage in erase threshold Vth distribution (distribution as to 1-Mbit memory cells)
Figure 45:
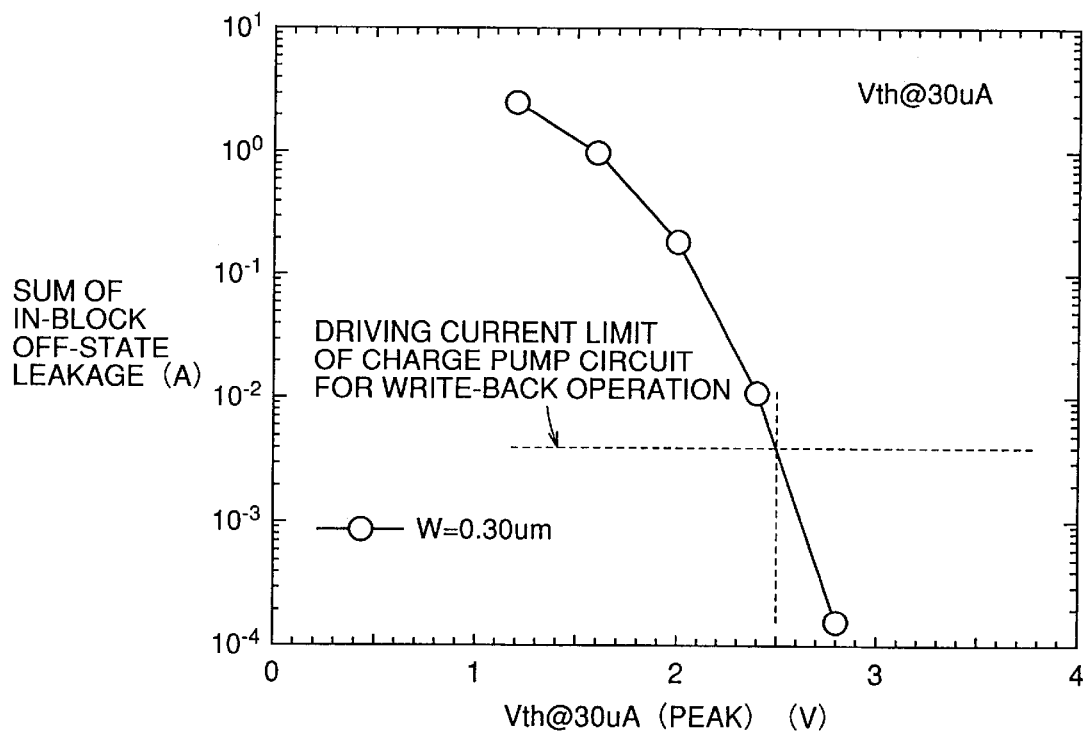
FIG. 45 illustrates the sum of off-state leakage of the overall post-erase threshold voltage Vth distribution.

When cell coupling is about 0.7 (cell Vg-Id characteristics shown in FIG. 42), off-state leakage of the erase threshold Vth distribution reaches a value of about 4 mA, i.e., the upper limit of the driving current of the charge pump when the erase threshold Vth peak with the sense current sensitivity of 30 $\mu$A is 2.5 V, as shown in FIG. 45.

Assuming that Cono represents the capacitance between a control gate electrode and a floating gate electrode, Csub represents the capacitance between the floating gate electrode and the substrate, Cd represents the capacitance between the floating gate electrode and the drain region and Cs represents the capacitance between the floating gate electrode and the source region, cell coupling $\alpha$cg is expressed as follows:

$$\alpha cg = Cono/(Cono+Cd+Csub+Cs)$$

Increase of the cell coupling means that a voltage applied to the control gate electrode is efficiently transferred to the floating gate electrode and an electric field is also efficiently applied to a gate oxide film. This also means that the absolute value of the voltage applied to the control gate electrode in an erase operation or the like can be reduced.

In general, cell shape factors such as the thicknesses of a tunnel oxide film and the ONO film and the channel width are so scaled as to keep the cell coupling at 0.7, in order to maintain the cell characteristics.

It is difficult to control spreading of the post-erase threshold voltage Vth distribution, and its half breadth must be estimated by up to about 1 V in consideration of dispersion in mass production or the like.

Therefore, it follows that the aforementioned sense current sensitivity of 30 $\mu$A defines the peak position Vth.peak of the erase threshold voltage Vth.

Figure 6:
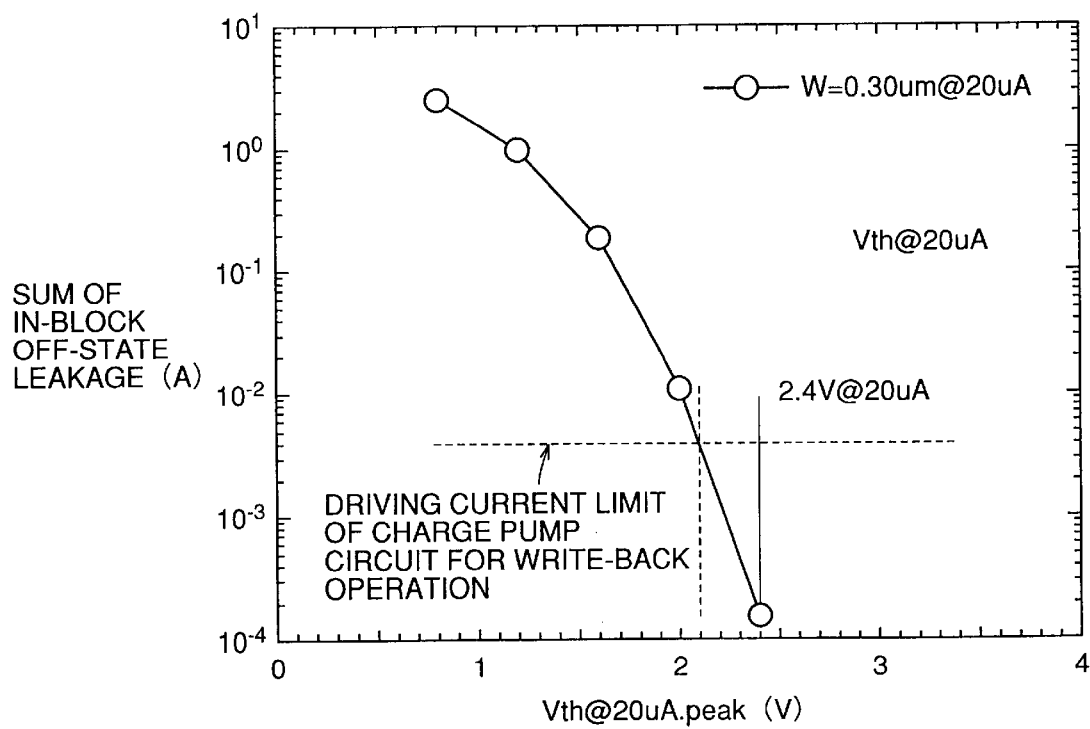
FIG. 6 illustrates dependency of the sum of off-state leakage in overall post-erase threshold voltage Vth distribution on a peak threshold voltage Vth.peak.

Thus, the inventive nonvolatile semiconductor memory device performing self-selective write-back after completion of erase verification defines the upper limit of the sense current sensitivity as follows:

FIG. 6 shows peak threshold voltage Vth dependency of the sum of off-state leakage of the overall post-erase threshold voltage Vth distribution of a 64-KB (512-Kbit) block in the case of reducing the sense current sensitivity beyond that in FIG. 45.

When reducing the sense current sensitivity to 20 $\mu$A, the peak value Vth.peak of the threshold voltage defining the driving current upper limit of 4 mA of the charge pump reaches 2.1 V. In other words, the value of the peak threshold voltage Vth.peak is reduced by about 0.4 V as compared with that with the sense current sensitivity of 30 $\mu$A. This indicates that write-back with subthreshold CHE sufficiently functions even if the erase threshold Vth distribution is shifted to a lower side.

In general, the current sensitivity of the sense amplifier has been defined by such trade-off that it is desirable to increase the sense current sensitivity (the drain current value Id subjected to sense determination) in consideration of improvement of the access speed in the first place while it is desirable to reduce the sense current sensitivity in consideration of reduction of current consumption in the sense amplifier in the second place.

In the nonvolatile semiconductor memory device according to the first embodiment, the sense current sensitivity is defined according to such a third condition that the sum of off-state leakage per erased block (each of the memory blocks MBL0 to MBLn shown in FIG. 1) corresponding to the distribution of the threshold voltages Vth after completion of the erase operation is lower than the drivability of the charge pump circuit CP when driving the bit line with the charge pump circuit CP and performing self-selective write-back in addition to the aforementioned first and second conditions.

Generally under such a condition that the threshold voltage peak Vth.peak is 2.5 V when setting an erase verify level to 3.5 V, the off-state leakage value is sufficiently low as compared with the charge pump driving limit. Therefore, the charge pump output voltage can be reliably kept at a desired value of about 5 V, for example, thereby enabling sufficient write-back.

Second Embodiment

A second embodiment of the present invention is characterized in that the lower limit of an erase verify level is decided in view of off-state leakage in a nonvolatile semiconductor memory device having the structure of the nonvolatile semiconductor memory device 1000, selecting a bit line in a non-selected state of a word line, self-selectively writing back only an overerased cell on the selected bit line and performing the aforementioned write-back operation after completion of erase verification, as described below.

The nonvolatile semiconductor memory device according to the second embodiment is similar in structure to the nonvolatile semiconductor memory device according to the fist embodiment except the setting of the erase verify level described below.

When cell coupling is about 0.7 (cell Vg–Id characteristics shown in FIG. 42) as shown in FIG. 45, the erase verify level is set to 3.5 V with sense current sensitivity of 30 μA and an erase Vth peak is 2.5 V assuming that the half breadth of erase distribution is up to 1 V, off-state leakage of erase threshold Vth distribution reaches a value of about 4 mA, i.e., the driving current upper limit of a charge pump, as described with reference to the first embodiment.

In general, cell shape factors such as the thicknesses of a tunnel oxide film and an ONO film and a channel width are so scaled that the cell coupling is kept at 0.7, in order to maintain the cell characteristics. Further, a half breadth must be estimated by up to about 1 V as to spreading of post-erase threshold Vth distribution as described above.

Therefore, it follows that the aforementioned value 3.5 V of the erase verify level defines the peak position Vth.peak of the erase Vth.

Thus, the nonvolatile semiconductor memory device according to the second embodiment performing write-back with subthreshold CHE after completion of erase verification defines the upper limit of the erase verify level as follows:

When setting the lower limit of the erase verify level (potential applied to a word line in an erase verify operation) to 3.5 V in FIG. 45, the value of a Vth peak corresponding thereto reaches 2.5 V also when the sense current sensitivity is 30 μA since the half breadth of the threshold distribution is up to about 1 V, and the off-state leakage value is sufficiently low as compared with the charge pumping driving limit. If the erase verify level exceeds this, it follows that the sum of off-state leakage is not more than 4 mA and write-back with subthreshold CHE sufficiently functions.

Figure 7:
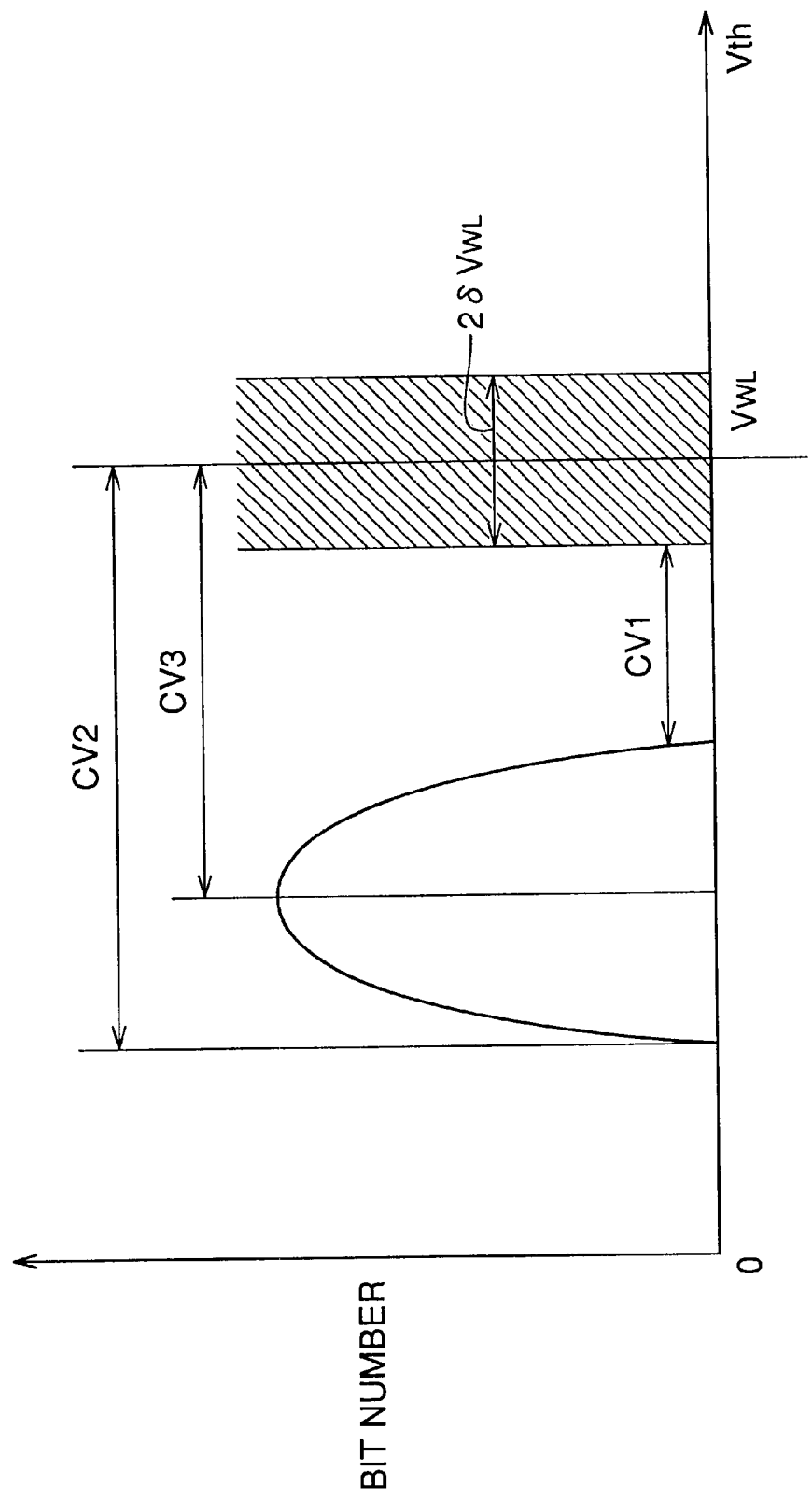
FIG. 7 is a conceptual diagram showing factors defining post-erase threshold distribution.

FIG. 7 is a conceptual diagram showing the aforementioned factors defining the post-erase threshold distribution.

Assuming that $V_{WL}$ represents a potential applied to a word line in a read operation in FIG. 7, those defining the verify level in general are such a first condition that the verify level must be set to provide a margin by a value CV1 from $V_{WL}-\delta V_{WL}$ with respect to the upper limit of the post-erase threshold distribution in consideration of that the potential $V_{WL}$ fluctuates by $\pm\delta V_{WL}$ from a designed value in the read operation and such a second condition that a margin as to a value CV2 is required for the lower limit of the post-erase threshold distribution so that no overerasing is caused in memory cells having low thresholds in the post-erase threshold distribution.

The nonvolatile semiconductor memory device according to the second embodiment defines the verify level according to a condition of providing a margin of a value CV3 to a peak of the post-erase threshold distribution for obtaining post-erase threshold distribution satisfying such a third condition that the sum of off-state leakage per erased block (each of the memory blocks MBL0 to MBLn shown in FIG. 1) corresponding to distribution of the threshold voltages Vth after completion of an erase operation is lower than the drivability of a charge pump circuit when driving a bit line with the charge pump circuit CP and performing self-selective write-back, in addition to the aforementioned first and second conditions.

A stable write-back operation can be implemented with a simple circuit structure also by defining the verify level in the aforementioned manner.

Figure 8:
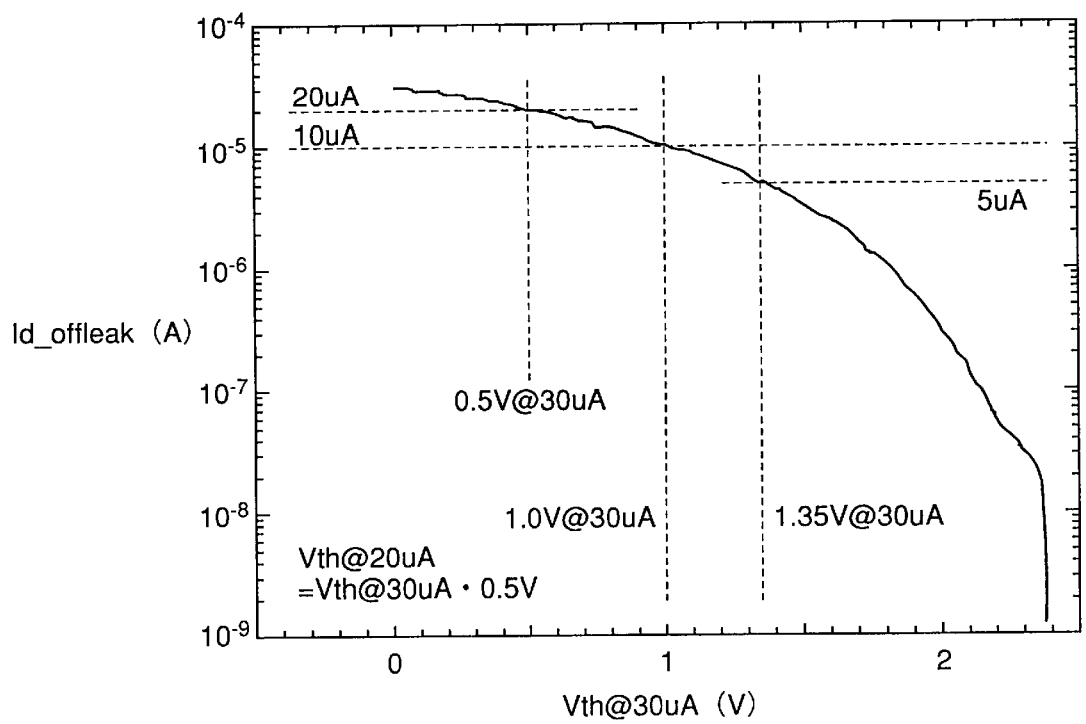
FIG. 8 illustrates the relation between the threshold voltage Vth of a single memory cell and the magnitude of off-state leakage.

FIG. 8 illustrates the relation between the threshold voltage Vth. of a single memory cell and the magnitude of off-state leakage.

The off-state leakage current monotonously decreases following increase of the threshold voltage Vth (sense amplifier current sensitivity: 30 μA), from which it is understood that the value of the lower limit threshold Vth in the threshold distribution in the erased block is defined in consideration of to what value to suppress the off-state leakage current, for example.

Figure 9:
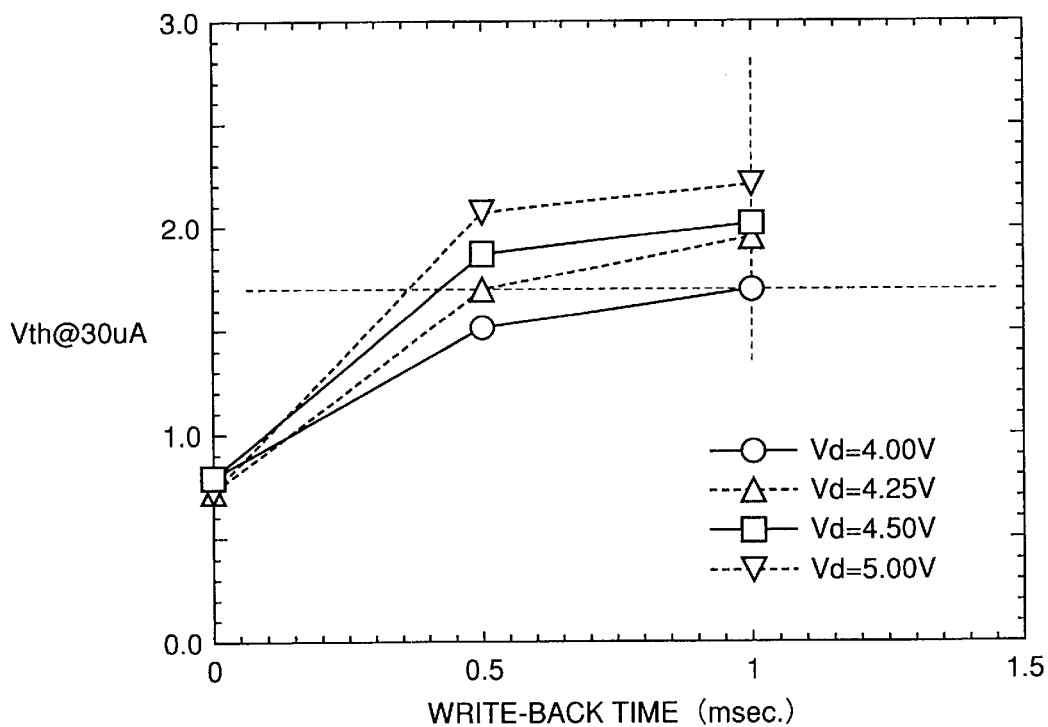
FIG. 9 illustrates write-back time dependency of the threshold Vth (sense amplifier current sensitivity: 30 $\mu$A)

FIG. 9 illustrates write-back time dependency of the threshold Vth (sense amplifier current sensitivity: 30 μA).

Referring to FIG. 9, drain voltages Vd of 4.00 V, 4.25 V, 4.50 V and 5.00 V are employed as parameters.

It is understood that a write-back time of about 1 msec. is sufficient if the drain voltage Vd is greater than 4 V, and write-back can be performed at a higher speed as compared with the prior art.

Third Embodiment

A third embodiment of the present invention is characterized in that the bit number of subblocks subjected to collective write-back is smaller than the bit number of an erased block, to which the subblocks belong, subjected to collective erasing in view of off-state leakage in a nonvolatile semiconductor memory device selecting a bit line in a non-selected state of a word line, self-selectively writing back only an overerased cell on the selected bit line and performing the aforementioned write-back operation after completion of erase verification.

A flash memory collectively performs an erase operation with respect to a bit number. A set of bits is referred to as a block. In consideration of user friendliness, a magnitude of about 64 KB (512 Kbits) is generally employed for a single block.

If an erase threshold Vth peak reaches 2.5 V when cell coupling is about 0.7 as shown in FIG. 45 and an erase verify level is set to 3.5 V with sense current sensitivity of 30 μA on the assumption that the half breadth of erase distribution is up to 1 V, however, off-state leakage of erase threshold Vth distribution reaches a value of about 4 mA, i.e., the driving current upper limit of a charge pump.

When collectively writing back this block, it follows that small fluctuation of the erase threshold Vth distribution such as shifting to a low threshold Vth side, for example, remarkably influences the write-back characteristics.

In the nonvolatile semiconductor memory device according to the third embodiment performing write-back with subthreshold CHE after completion of erase verification, therefore, the number of bits supplied with a bit line potential in write-back is set smaller than that of the erased block. This is hereinafter referred to as "write-back subblock", which is distinguished from "erased block" collectively subjected to an erase operation.

Figure 10:
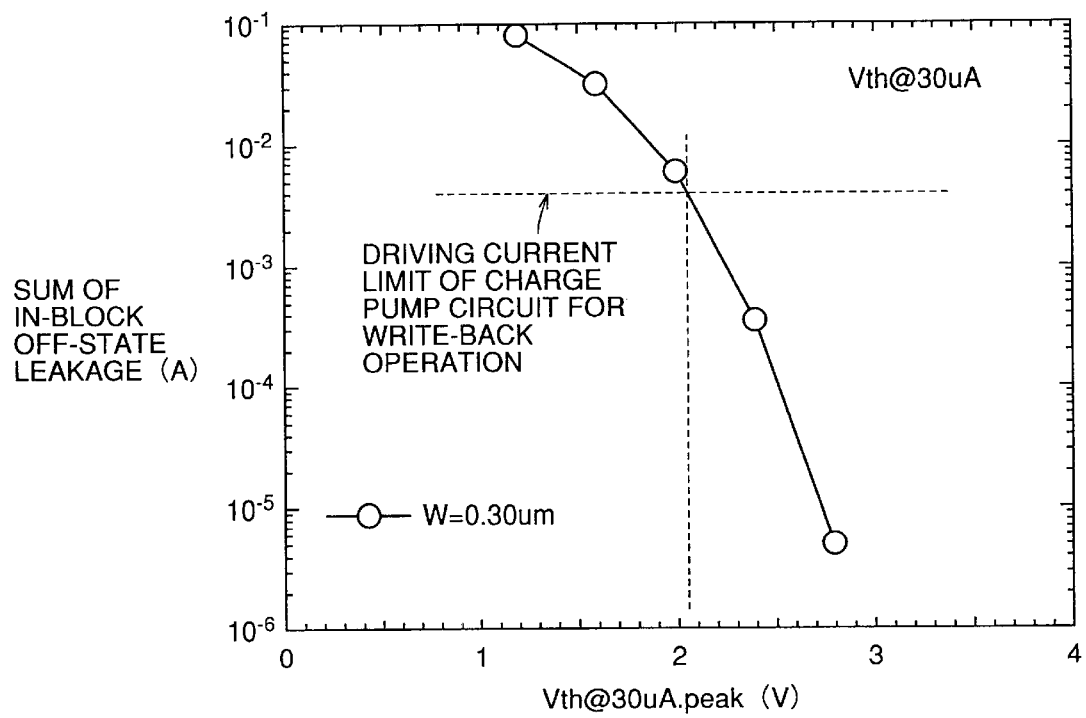
FIG. 10 illustrates a result of calculation of dependency of the sum of off-state leakage on a threshold voltage peak (sense amplifier current sensitivity: 30 $\mu$A)
Figure 11:
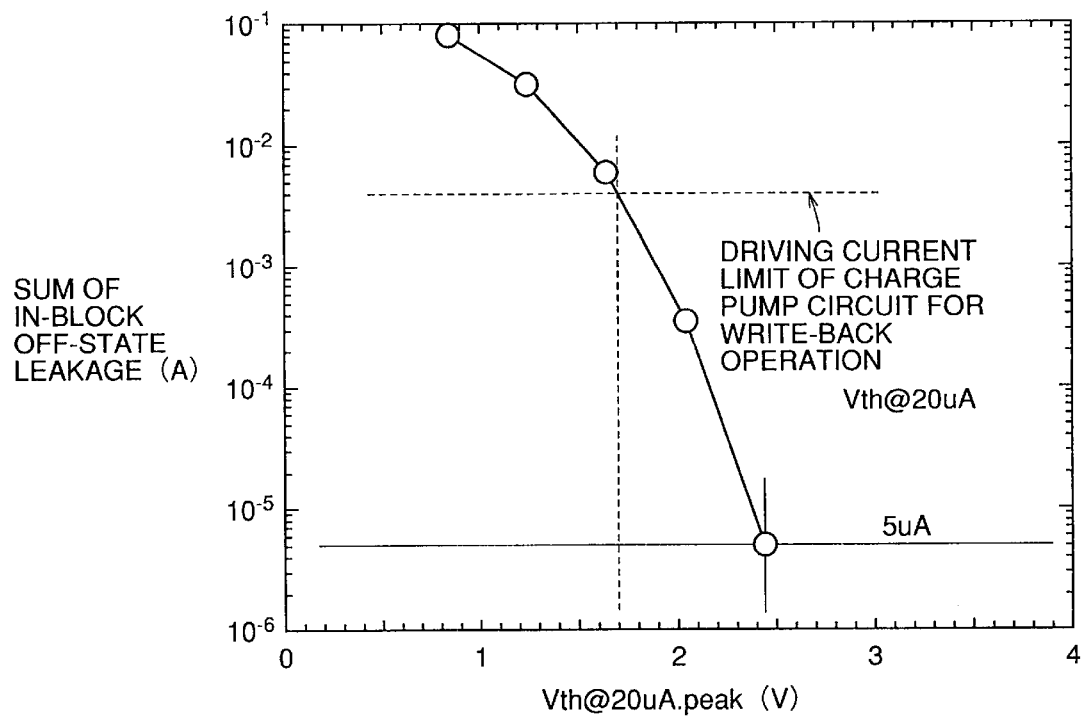
FIG. 11 illustrates a result of calculation of dependency of the sum of off-state leakage on a threshold voltage peak (sense amplifier current sensitivity: 20 $\mu$A)

FIGS. 10 and 11 show results of calculation of threshold voltage peak dependency of the sum of off-state leakage relation to a subblock size of 2 KB.

Figure 20:
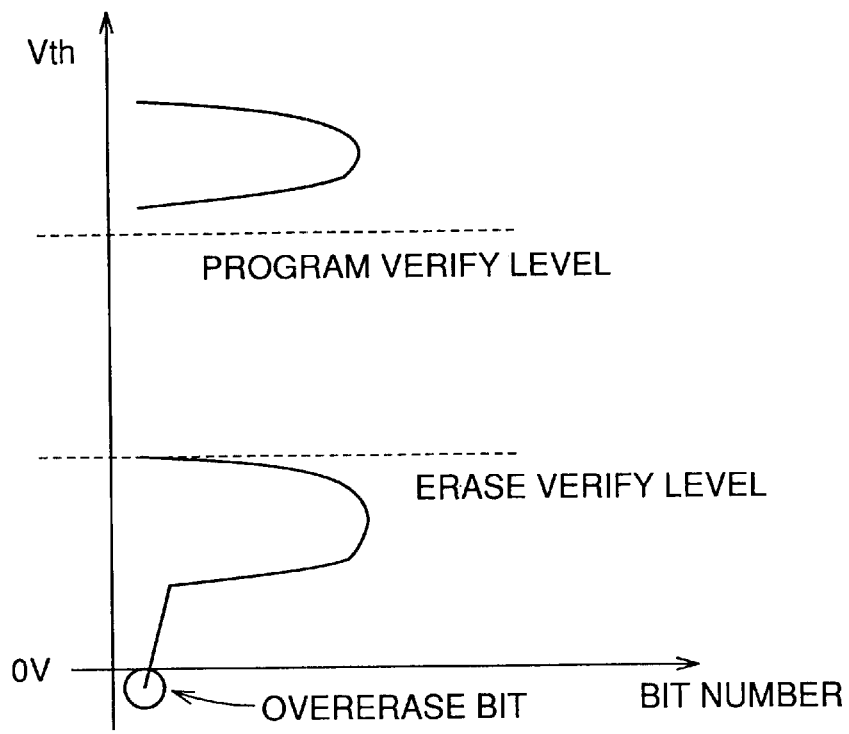
FIG. 20 is a conceptual diagram showing the relation between a program (write) verify level, an erase verify level and threshold distribution of memory cell transistors.

Current sensitivity of a sense amplifier is 30 μA in FIG. 10 and 20 μA in FIG. 11 respectively.

The value of a threshold voltage peak Vth.peak reaching a charge pump driving current rate-controlled value can be reduced to 2.1 V.

In a method according to the third embodiment, a 64-KB erased block is divided into 32 2-KB blocks, for example, for writing back each subblock.

According to this method, the off-state leakage value can be sufficiently reduced and hence the write-back time for each subblock can be set shorter as compared with the case of collectively writing back the erased block.

Fourth Embodiment

A fourth embodiment of the present invention is characterized in that, in a nonvolatile semiconductor memory device selecting a bit line in a non-selected state of a word line, self-selectively writing back only an overerased cell on the selected bit line and performing the aforementioned write-back operation after completion of erase verification characterized in that the bit number of subblocks subjected to collective write-back is smaller than the bit number of an erased block, to which the subblocks belong, subjected to collective erasing in view of off-state leakage, bits belonging to each subblock are read by a common sense amplifier.

In a flash memory, in-block bits are read with a plurality of sense amplifiers 210. In other words, the state of the threshold voltage Vth of each memory cell is determined with the sense amplifiers 210.

Figure 12:
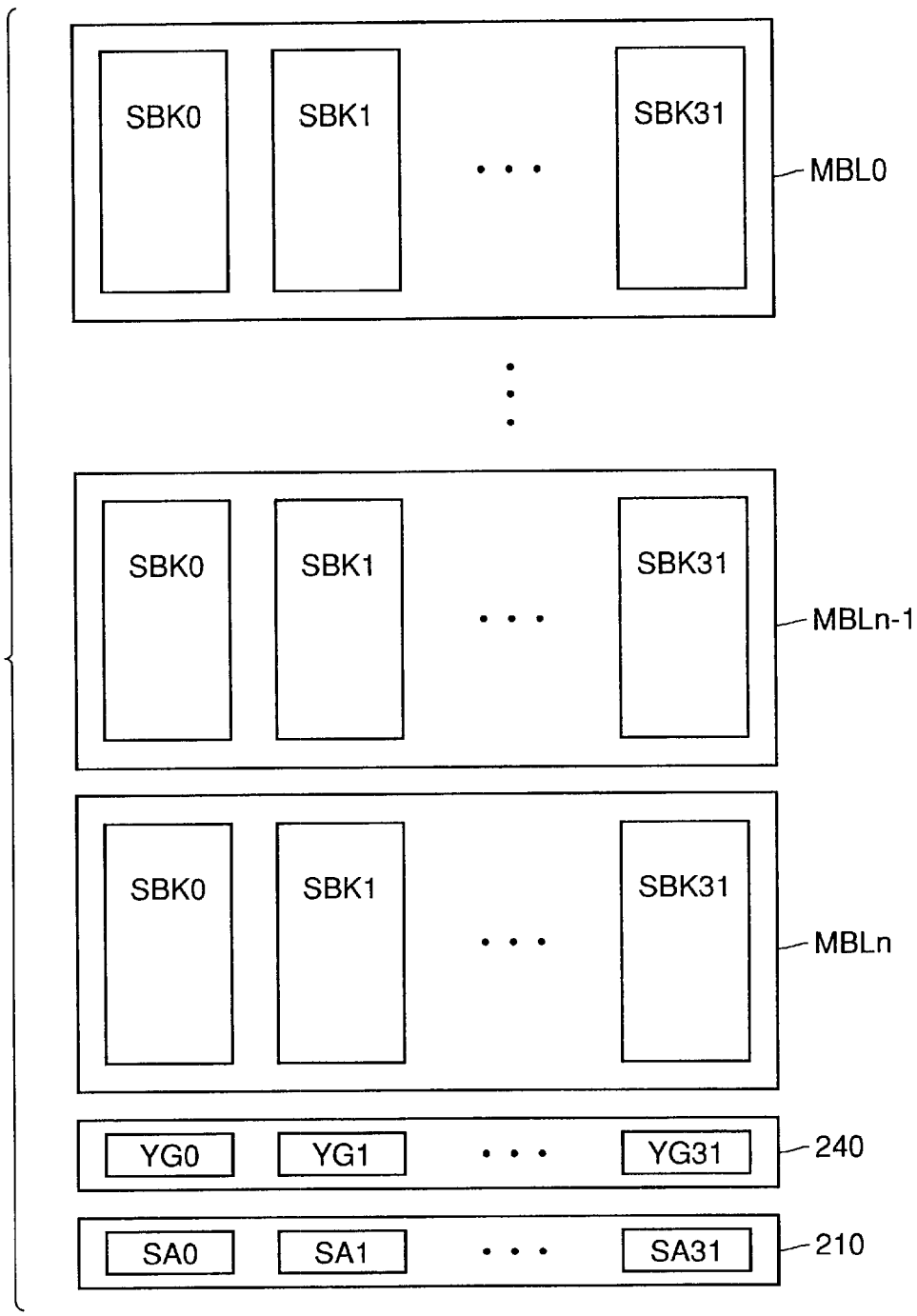
FIG. 12 is a schematic block diagram showing arrangement of a memory cell array and sense amplifiers according to a fourth embodiment of the present invention.

FIG. 12 is a schematic block diagram showing arrangement of a memory cell array and sense amplifiers according to the fourth embodiment.

In the structure of the nonvolatile semiconductor memory device 1000 shown in FIG. 1, each of the memory blocks MBL0 to MBLn forming erase units is divided into 32 subblocks SBK0 to SBK31, for example.

It is assumed that 64 subbit lines SBL are arranged in each subblock and a main bit line MBL is provided in common in each memory block. In other words, 64 main bit lines MBL are provided in common to (n+1) subblocks SBK0 arranged along a column direction, for example.

It is also assumed that the column-system control circuit 240 is provided with Y gate parts YG0 to YG31 in correspondence to the respective subblocks, and the sense amplifier zone 210 is also divided into sense amplifier subblocks SA0 to SA31 in correspondence to the respective subblocks.

In other words, each of the Y gate parts YG0 to YG31 selects the 64 main bit lines, and connects the same to one sense circuit among the corresponding sense amplifier subblocks SA0 to SA31. That is, each of the sense amplifier subblocks SA0 to SA31 can operate independently of the remaining sense amplifier subblocks.

A write-back operation can be reliably performed with small off-state leakage by collectively selecting the main bit lines of subblocks having the sense amplifier subblocks in common in the Y gate parts in write-back.

In the above description, the sense amplifier subblocks and the Y gate parts are provided in common to the plurality of memory blocks MBL0 to MBLn in correspondence to the DINOR memory cell array of the nonvolatile semiconductor memory device 1000.

With respect to a NOR memory cell array, however, the sense amplifier subblock and the Y gate part may be provided for each of the memory cell blocks MBL0 to MBLn, for example. Also in this case, a write-back operation can be reliably performed with small off-state leakage by collectively selecting bit lines of a write-back subblock corresponding to the sense amplifier subblock with the Y gate part.

Fifth Embodiment

A fifth embodiment of the present invention is characterized in that, in a nonvolatile semiconductor memory device selecting a bit line in a non-selected state of a word line, self-selectively writing back only an overerased cell on the selected bit line and performing a write-back operation after completion of erase verification, characterized in that the bit number of subblocks subjected to collective write-back is smaller than the bit number of an erased block, to which the subblocks belong, subjected to collective erasing in view of off-state leakage and bits belonging to each subblock are read by a common sense amplifier, an off-state leakage value of each subblock is determined with the sense amplifier for writing back only a subblock exhibiting a value exceeding a certain critical value.

In the method of subblock division described with reference to the fourth embodiment, the write-back count is increased as compared with the case of performing no subblock division. In other words, an excess time is required for the write-back operation by (write-back time for one subblock)×(subprogram number).

Therefore, whether or not to perform write-back is determined in an initial stage of the write-back operation with the sense amplifier.

Referring to FIG. 12, the Y gate parts YG0 to YG31 select all subblocks for measuring off-state leakage values thereof with the sense amplifiers. When divided into 2-KB subblocks, for example, the sum of off-state leakage with the sense current sensitivity of 30 $\mu$A and a threshold peak value Vth.peak of 3.0 V is about 10 $\mu$A from FIG. 10.

In each sense amplifier, therefore, a circuit capable of determining a write-back block determination current (e.g., 5 $\mu$A) lower than that in general reading (sense current sensitivity: 30 $\mu$A) is added.

Figure 13:
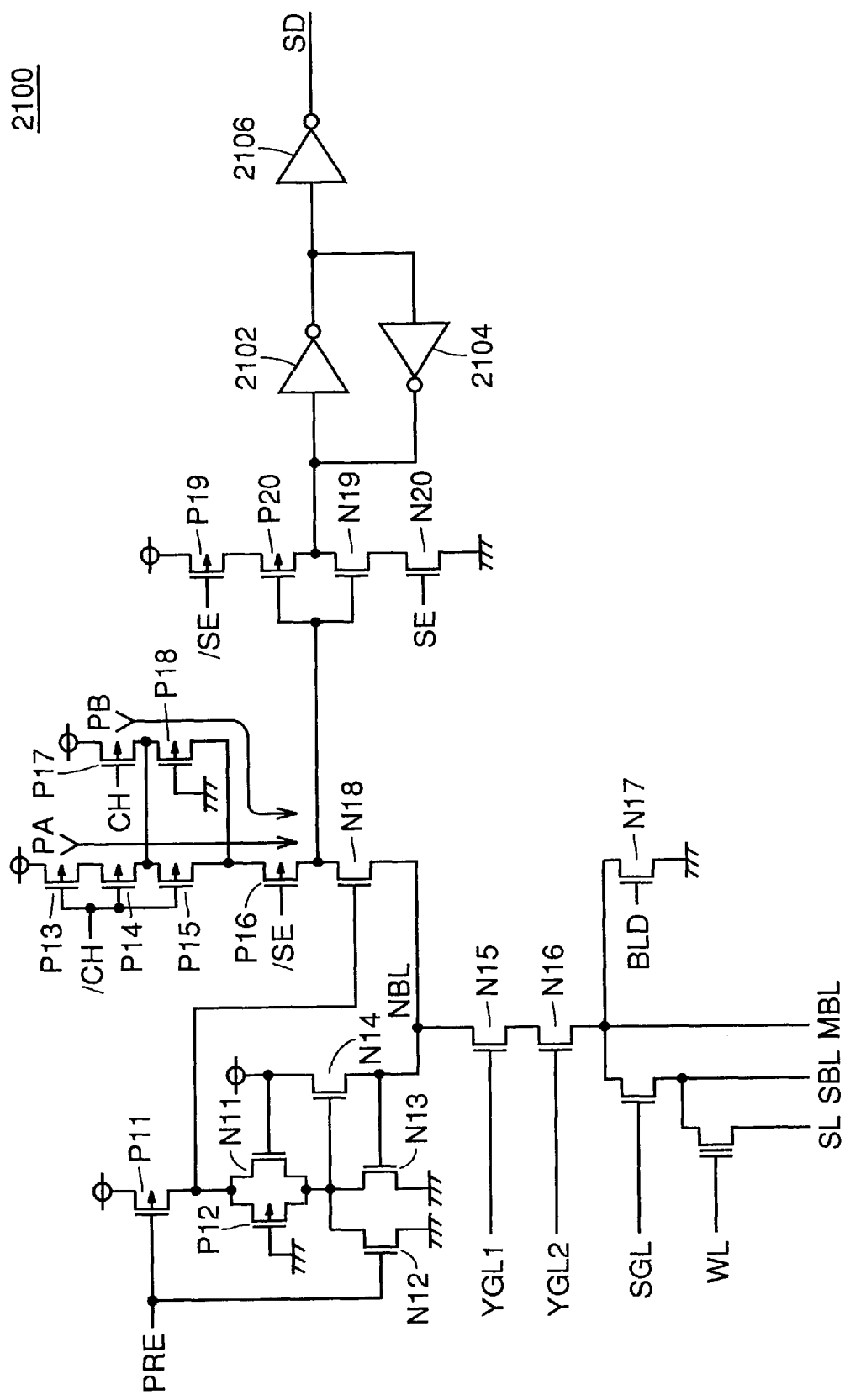
FIG. 13 is a circuit diagram showing the structure of a sense circuit 2100.

FIG. 13 is a circuit diagram showing the structure of a sense circuit 2100 having variable sense current sensitivity.

Referring to FIG. 13, the sense circuit 2100 includes a P-channel MOS transistor P11 and N-channel MOS transistors N11 and N13 serially connected between a power supply potential Vcc and a ground potential GND. The gate of the transistor P11 receives a precharge signal PRE.

A P-channel MOS transistor P12 receiving the ground potential in its gate is provided in parallel with the transistor N11, and an N-channel MOS transistor P13 receiving the precharge signal PRE in its gate is provided in parallel with the transistor N13.

The sense circuit 2100 further includes N-channel MOS transistors N14, N15 and N16 serially connected between the power supply potential Vcc and a main bit line MBL.

The source of the transistor N14 coupled with the power supply potential Vcc is connected with the gate of the transistor N11, and the drain of the transistor N14 coupled with an internal node NBL is connected with the gate of the transistor N13.

The transistors N15 and N16, included in a corresponding Y gate part, receive signals YGL1 and YGL2 from a Y decoder 200 in the gates thereof respectively.

The sense circuit 2100 further includes P-channel MOS transistors P13, P14, P15 and P16 and an N-channel MOS transistor N18 serially connected between the power supply potential Vcc and the internal node NBL. The gates of the transistors P13, P14 and P15 receive a signal/CH activated (low) in a general read operation. The gate of the transistor P16 receives a signal/SE activated (low) for instructing activation of a sense operation.

The sense circuit 2100 further includes P-channel MOS transistors P17 and P18 serially connected between the power supply potential Vcc and the node between the transistors P15 and P16. The gate of the transistor P17 receives a signal CH inactivated (high) in the general read operation and activated (low) in a write-back block determination operation. The gate of the transistor P18 is coupled with the ground potential.

Therefore, a current is supplied through a path PA in FIG. 13 in the general read operation mode, while the current is supplied through a path PB in the write-back block determination operation.

The sense circuit 2100 further includes P-channel MOS transistors P19 and P20 and N-channel MOS transistors N19 and N20 serially connected between the power supply potential Vcc and the ground potential. The transistor P19 receives the signal /SE, and the gate of the transistor N19 receives a signal SE, which is an inverted signal of the signal /SE. The gates of the transistors P20 and N19 are coupled with the node between the transistors P16 and N18.

The sense circuit 2100 further includes an inverter 2102 having an input node coupled with the node between the transistors P20 and N19, an inverter 2104 having an input node coupled with an output node of the inverter 2101 and an output node coupled with the input node of the inverter 2102 for forming a latch circuit, and an inverter 2106 receiving an output from the inverter 2102 for outputting read data SD.

The transistor N17 is rendered conductive in response to a signal BLD for discharging a bit line maintained in a floating state with a high voltage in an erase operation, for example.

When all subblocks are selected, a read voltage of 1 V, for example, is applied to bit lines and a read current is larger than a write-back determination current value of 5 µA (>sum of off-state leakage of subblocks having a normal erase distribution width), for example, in a write-back operation for a memory cell array divided into write-back subblocks, it can be determined that overerased cells are present in the subblocks or a plurality of cells not overerased but almost overerased are present on the same bit line to result in false determination of overerasing, due to the aforementioned structure of the sense circuit 2100.

Thus, the write-back time can be reduced by writing back only subblocks including overerased cells. In other words, it follows that the count of write-back can be reduced.

Sixth Embodiment

A write-back method according to a sixth embodiment of the present invention is characterized in that application of an erase pulse and write-back are performed as a set in a flash memory employing a method of selecting a bit line in a non-selected state of a word line and self-selectively writing back only an overerased cell on the selected bit line.

Figure 41:
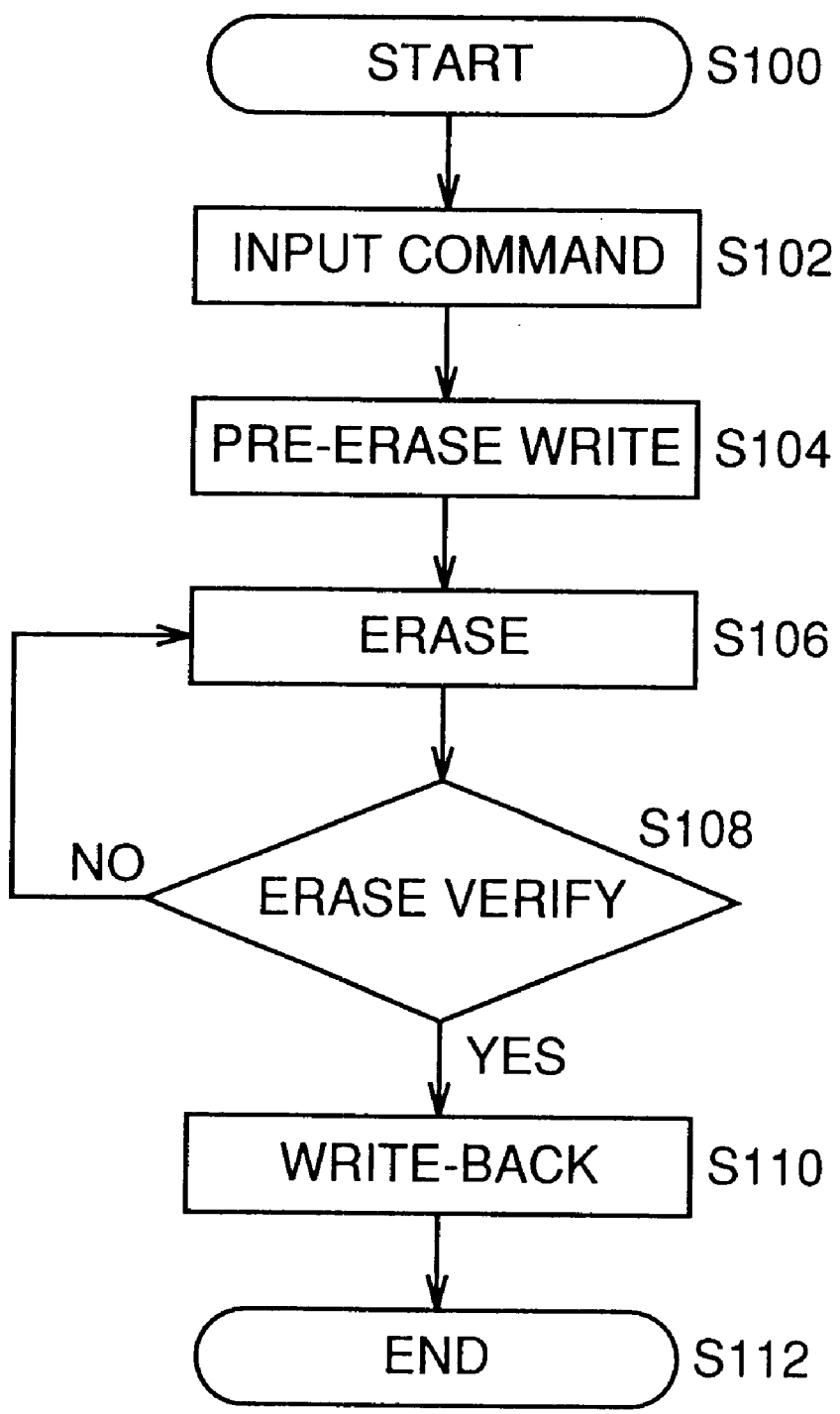
FIG. 41 is a flow chart for illustrating an erase sequence with self-selective write-back.

In the conventional write-back method, write-back is performed after completion of erase verification, as shown in FIG. 41. In this case, write-back may abnormally function in view of the driving current of the charge pump if off-state leakage is increased as described above.

In the sixth embodiment, therefore, write-back is performed before completion of erase verification, i.e., from such a state that a peak threshold Vth.peak is present at a high Vth value with a small off-state leakage value thereby repairing an overerased state.

Figure 14:
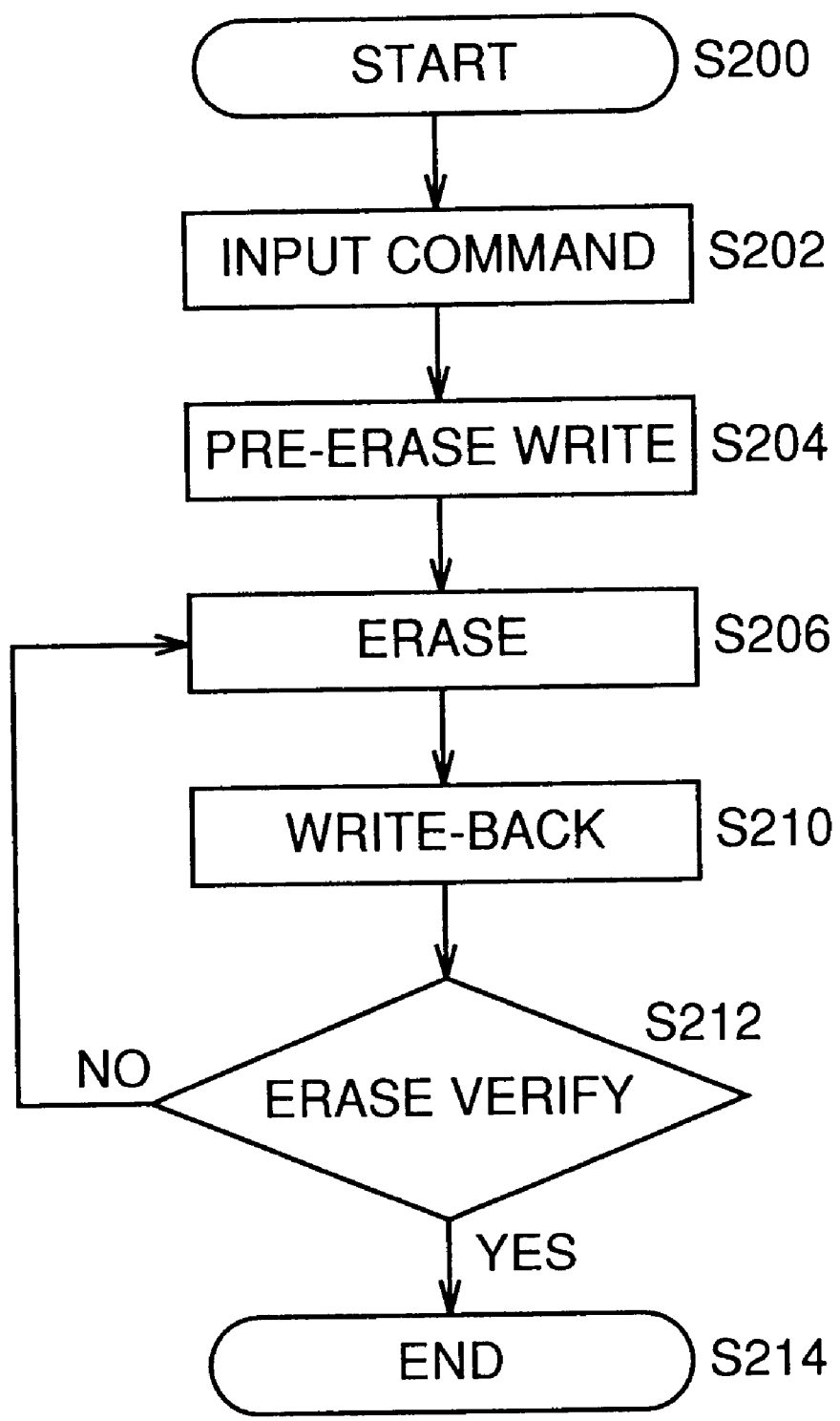
FIG. 14 is a flow chart for illustrating an erase and write-back sequence according to a sixth embodiment of the present invention.

FIG. 14 is a flow chart for illustrating an erase and write-back sequence according to the sixth embodiment.

When the erase and write-back sequence is started (step S200), the following sequence operation is instructed by a command input (step S202).

Then, the thresholds of memory cells are set to high levels due to a pre-erase write operation (step S204), and an erase pulse is applied to memory cells in each erased block (step S206). Thereafter a write-back pulse is applied to each write-back block (step S210).

The write-back block may be identical to the erased block, or the erased block may be further divided. When the erased block is divided, the write-back pulse is successively applied to write-back blocks in the erased block supplied with the erase pulse.

Then, erase verification is performed so that the process returns to the step S206 when the thresholds of the memory cells in the erased block are determined as not reaching a prescribed value (step S212) while the process is ended (step S214) when it is determined that the thresholds of all memory cells reach the prescribed level (step S212).

Thus, the write-back operation can be performed in such a range that a charge pump circuit is normally operable by continuously performing the erase operation and the write-back operation, whereby occurrence of memory cells on a low threshold side is suppressed and excellent post-erase threshold distribution can be obtained.

Seventh Embodiment

A write-back method according to a seventh embodiment of the present invention is characterized in that, in a non-volatile semiconductor memory device employing a method of selecting a bit line in a non-selected state of a word line and self-selectively writing back only an overerased cell on the selected bit line, write-back characterized in that application of an erase pulse and write-back are performed as a set is not performed in an initial stage of an erase operation.

In the write-back method according to the sixth embodiment, the erase time of the device is increased due to the write-back operation when repeating application of the erase pulse and write-back every erase pulse.

Assuming that erasing performed with an erase pulse width of 5 msec. and a write-back pulse width of 1 msec. is completed in up to 1 sec. (200 erase pulses), for example, the erase time of the device disadvantageously reaches 1.2 sec. in the method according to the sixth embodiment ((5 msec.+1 msec.)×200=1.2 sec.).

According to the seventh embodiment, therefore, no write-back is performed in the initial stage of erasing, in order to reduce the erase time of the device.

Figure 15:
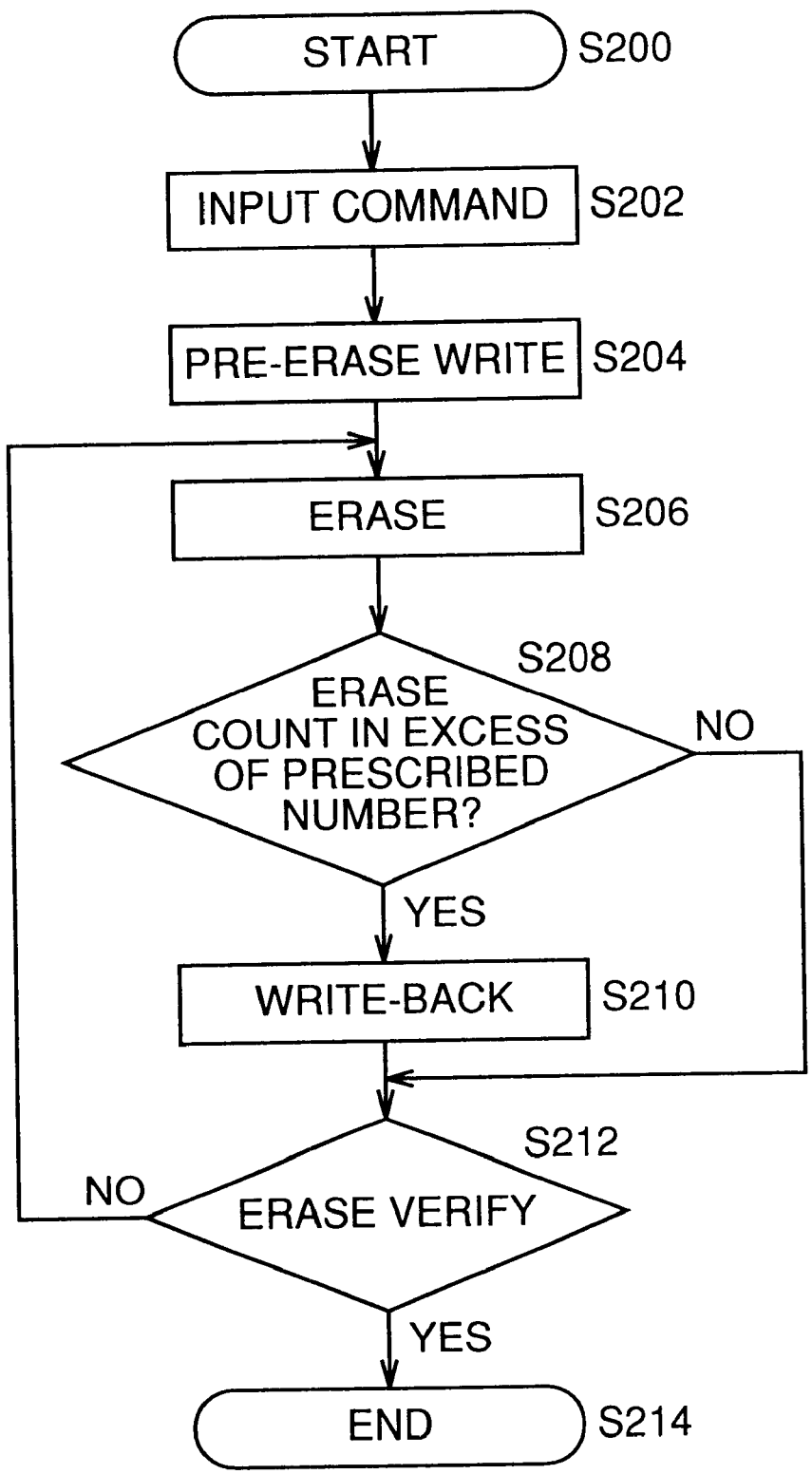
FIG. 15 is a flow chart for illustrating an erase and write-back sequence according to a seventh embodiment of the present invention.

FIG. 15 is a flow chart for illustrating an erase and write-back sequence according to the seventh embodiment.

When the erase and write-back sequence is started (step S200), the following sequence operation is instructed by a command input (step S202).

Then, the thresholds of memory cells are set to high levels due to a pre-erase write operation (step S204), and an erase pulse is applied to memory cells in each erased block (step S206).

Thereafter determination is made as to whether or not the erase operation is ended by a prescribed count, and the processing advances to an erase verify operation at a step S212 if it is determined that the erase operation has not yet reached the prescribed count (step S208). If it is determined that the erase operation has reached the prescribed count (step S208), a write-back pulse is applied to each write-back block (step S210).

Also in the seventh embodiment, the write-back block may be identical to the erased block, or the erased block may be further divided. When the erased block is divided, the write-back pulse is successively applied to write-back blocks in the erased block supplied with the erase pulse.

In the erase very operation, the process returns to the step S206 when the thresholds of the memory cells in the erased block are determined as not reaching a prescribed value (step S212) while the process is ended (step S214) when it is determined that the thresholds of all memory cells reach the prescribed level (step S212).

Figure 16:
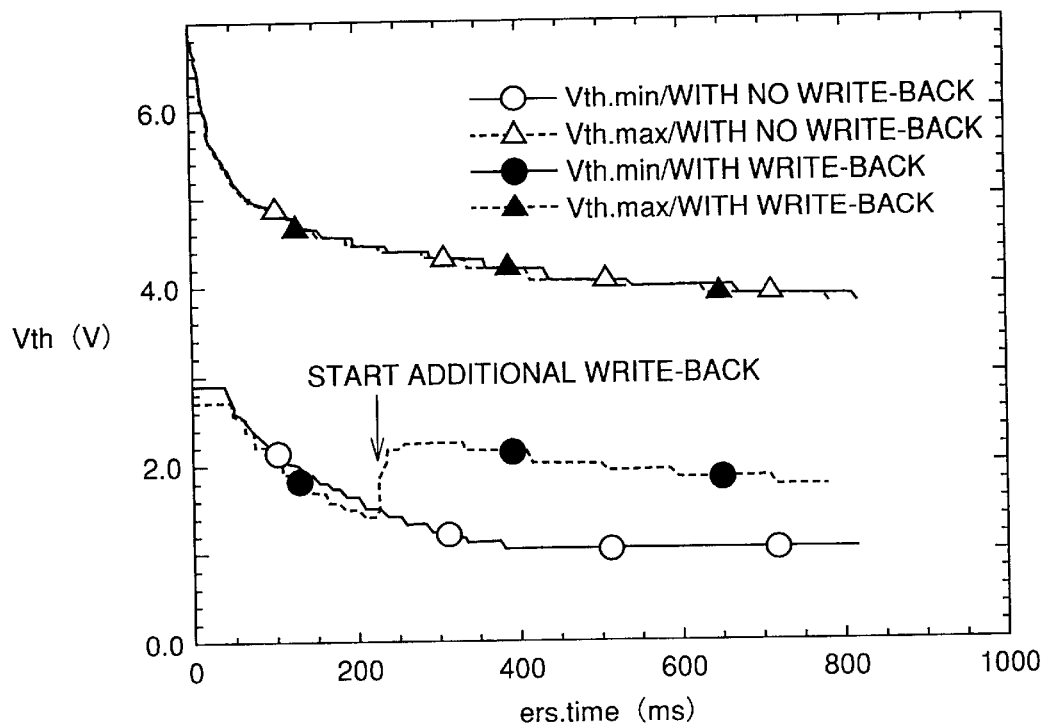
FIG. 16 illustrates time change of maximum and minimum thresholds of memory cells subjected to erasing in an erase sequence.

FIG. 16 illustrates time changes of maximum and minimum thresholds of memory cells in the case of performing erasing in the aforementioned erase sequence.

Referring to FIG. 16, write-back (step S210) is additionally performed in the erasing (steps S206 to S210) from a time t=250 msec.

Referring to FIG. 16, white circles show the change of the minimum threshold with no write-back and white triangles (erect) show the change of the maximum threshold with no write-back.

Black circles show the change of the minimum threshold with write-back, and black triangles (erect) show the change of the maximum threshold with write-back.

Self-selective write-back with subthreshold CHE is employed. It is assumed that the erase pulse width is 5 msec. and the write-back pulse width is 1 msec.

The array size is 1 Mbit. When not employing the write-back method according to the seventh embodiment, i.e., when simply repeating application of the erase pulse, the maximum threshold voltage Vth.max is up to 3.9 V and the minimum threshold voltage Vth.min is up to 1.0 V after a time of up to 800 msec.

When executing "application of the erase pulse and write-back" similar to that described with reference to FIG. 15 from after the time of 250 msec., the maximum threshold Vth.max is up to 3.9 V and the minimum threshold voltage Vth.min is up to 1.7 V, i.e., the bottoms of the low threshold side are controlled to high values after a time of up to 800 msec.

The bottoms of the high threshold Vth sides are essentially similar to those in the conventional erase method.

Thus, a write-back operation repairing an overerased state can be performed by the method according to the seventh embodiment.

According to the method of the seventh embodiment, write-back is performed from a state where the peak threshold voltage Vth.peak is high (i.e., a state where off-state leakage is small), whereby write-back on a low Vth side of erase distribution is reliably performed by simply supplying a short write-back pulse, as shown in FIG. 16.

Figure 17:
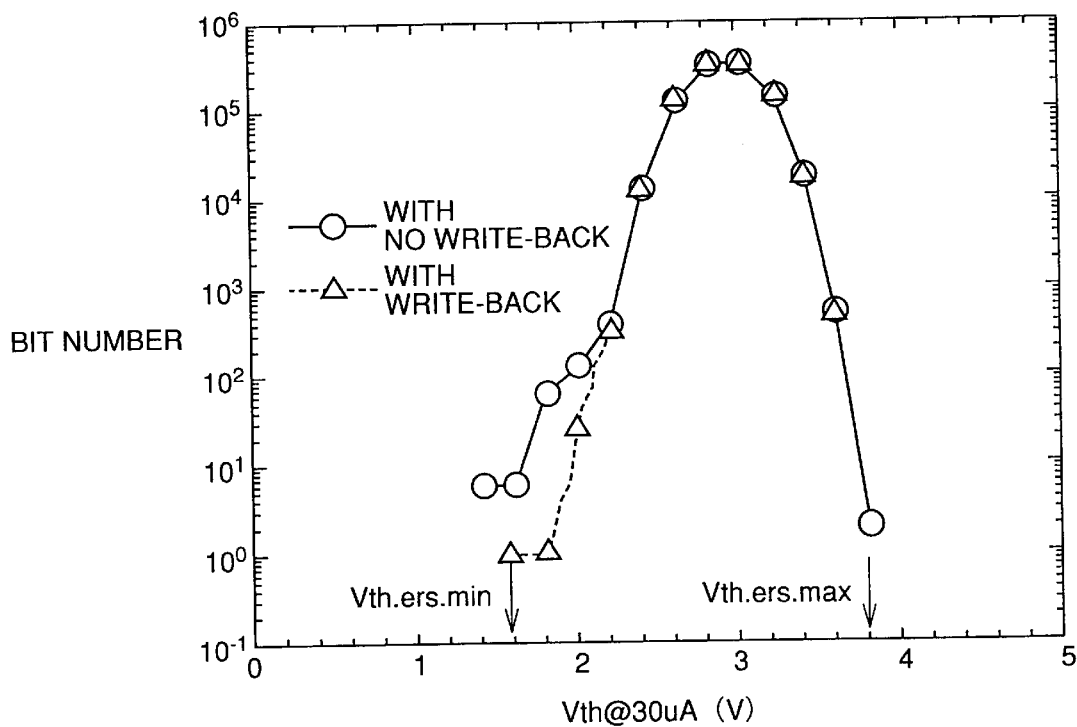
FIG. 17 illustrates erase threshold Vth distribution in the case of performing write-back by a method according to the seventh embodiment.

FIG. 17 illustrates erase threshold Vth distribution in the case of performing write-back according to the method of the seventh embodiment.

Referring to FIG. 17, white circles show the case of not performing the aforementioned write-back, and white triangles (erect) show the case of adding write-back processing.

Occurrence of memory cells on a low threshold side is suppressed and excellent post-erase threshold distribution is obtained.

As shown in FIG. 16, there is a small possibility for occurrence of overerased memory cells in the initial stage of erasing. Therefore, it is possible to reliably repair overerasing while reducing the erase time by adding write-back in a state where erasing properly progresses as shown in FIG. 16.

Eighth Embodiment

A write-back method according to an eighth embodiment of the present invention is characterized in that, in a nonvolatile semiconductor memory device employing a method of selecting a bit line in a non-selected state of a word line, self-selectively writing back only an overerased cell on the selected bit line and performing application of an erase pulse and write-back as a set as a write-back method therefor, the width of an erase pulse in an initial stage of an erase operation is rendered longer as compared with the erase cycle.

Figure 18:
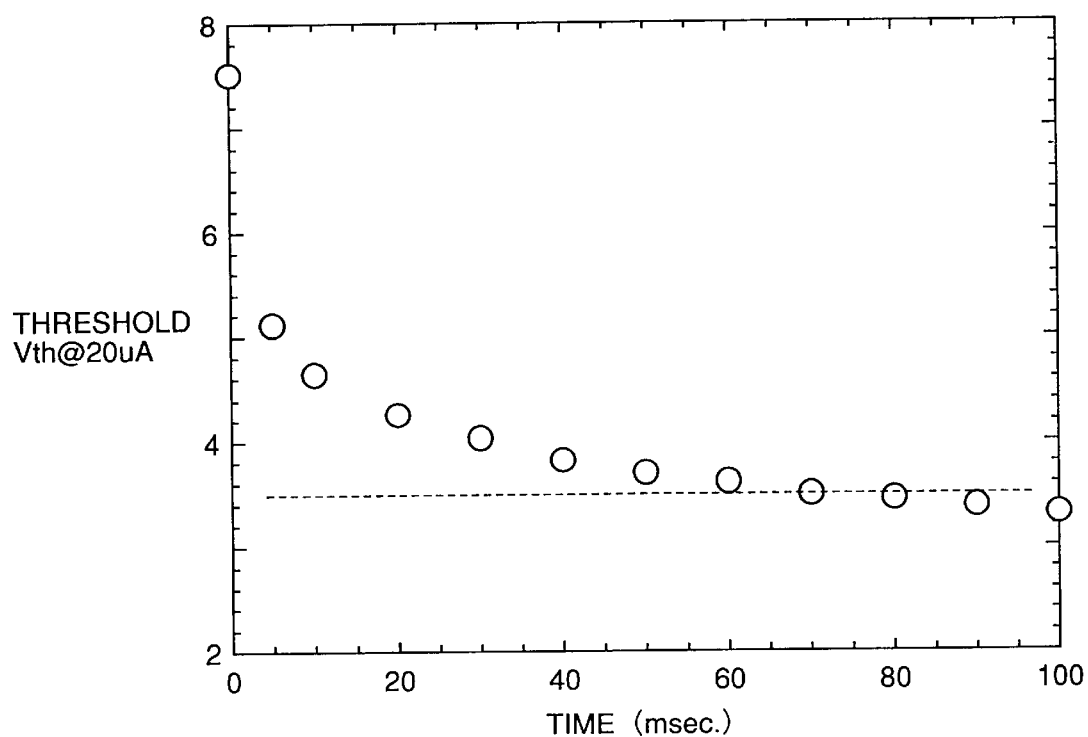
FIG. 18 illustrates the relation between an erase time and change of a threshold voltage Vth.

FIG. 18 illustrates the relation between the erase time and change of threshold voltages Vth in the case of evaluating the threshold voltages Vth of memory cells with a sense amplifier current sensitivity of 20 μA.

It is understood from FIG. 18 that fluctuation of the threshold voltages Vth caused by an erase pulse is substantially saturated in initial 100 msec.

The eighth embodiment also aims at reducing the erase time of the device, similarly to the aforementioned seventh embodiment. As shown in FIG. 16, the bottom on the low threshold Vth side is hardly overerased in the initial stage of erasing. Therefore, the erase pulse width is changed as follows, for example:

i) first erase pulse: erase time of 100 msec.+write-back of 1 msec.

ii) second to tenth erase pulses: erase time of 20 msec.+write-back of 1 msec.

iii) eleventh and subsequent erase pulses: erase time of 5 msec.+write-back of 1 msec.

Figure 19:
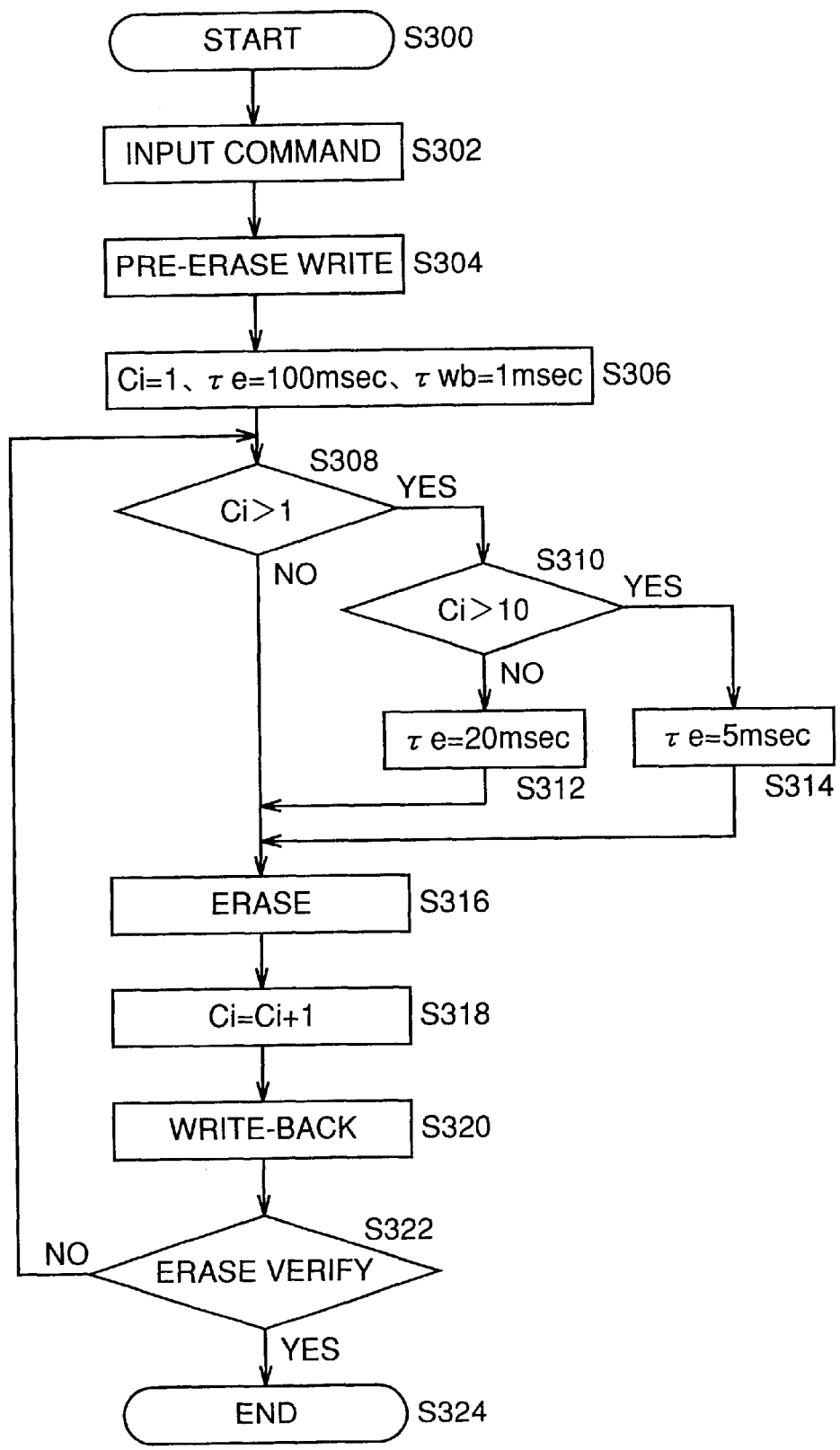
FIG. 19 is a flow chart for illustrating an erase and write-back sequence according to an eighth embodiment of the present invention.

FIG. 19 is a flow chart for illustrating an erase and write-back sequence according to the eighth embodiment.

When the erase and write-back sequence is started (step S300), the following sequence operation is instructed by a command input (step S302).

Then, the thresholds of memory cells are set to high levels due to a pre-erase write operation (step S304).

The value of a variable $c_i$ for counting application of the erase pulse is initialized to 1 while an erase time (pulse width) $\tau e$ and a write-back time $\tau wb$ are initialized to 100 msec. and 1 msec. respectively (step S306).

Then, determination is made as to whether or not the value of the count variable $c_i$ is greater than 1, so that the erase pulse is applied to memory cells in each erased block when the value of the variable $c_i$ is not greater than 1, i.e., when $c_i$=1 (step S316). Then, the value of the variable $c_i$ is incremented by 1 (step S318).

Thereafter a write-back pulse is applied to each write-back block (step S320).

Also in the eighth embodiment, the write-back block may be identical to the erased block, or the erased block may be further divided. When the erased block is divided, the write-back pulse is successively applied to write-back blocks in the erased block supplied with the erase pulse.

The process returns to the step S308 when the thresholds of the memory cells in the erased block are determined as not reaching a prescribed value in erase verification (step S322), while the process is ended (S324) when it is determined that the thresholds of all memory cells have reached the prescribed level (step S322).

If the value of the variable $c_i$ is determined as greater than 1 at the step S308, determination is made as to whether or not the variable $c_i$ is greater than 10 (step S310). If the variable $c_i$ is not greater than 10, the erase time (pulse width) $\tau e$ is changed to 20 msec. and the process advances to the step S316.

If the variable $c_i$ is greater than 10, the erase time (pulse width) $\tau e$ is changed to 5 msec. and the process advances to the step S316.

Thereafter similar processing is performed except that the erase time is different from that in the aforementioned operations in the case of $c_i$=1.

By employing such time distribution of the erase pulse, increase of the erase time can be suppressed also when performing each write-back in combination with the erase pulse due to the long pulse width in the initial stage of erasing, similarly to the sixth embodiment.

Ninth Embodiment

A write-back method according to a ninth embodiment of the present invention is characterized in that, in a nonvolatile semiconductor memory device employing a method of selecting a bit line in a non-selected state of a word line, self-selectively writing back only an overerased cell on the selected bit line and performing application of an erase pulse and write-back as a set while performing no write-back in an initial stage of an erase operation, a write-back pulse is added by sensing that a threshold voltage Vth on a higher side of post-erase Vth distribution reaches a certain value.

In other words, the ninth embodiment is characterized in that write-back is started by sensing that the maximum threshold Vth.max reaches a level below a certain critical value in the structure of the seventh embodiment.

As a method of such sensing, erase verification in FIG. 14 may be determined with two verify levels, for example.

Before describing this sensing method, the erase verification in FIG. 14 is briefly summarized.

FIG. 20 is a conceptual diagram showing the relation between a program (write) verify level and an erase verify level and threshold distribution of memory cell transistors.

In the example shown in FIG. 20, each of the program verify level and the erase verify level is a single value.

In a program operation, the program verify level output from a verify level generation circuit 100 is supplied to a word line and a write pulse is supplied to memory cell transistors until the memory cell transistors are cut off at this level.

In an erase operation, the erase verify level output from the verify level generation circuit 100 is supplied to the word line and an erase pulse is supplied to the memory cell transistors until the memory cell transistors are cut off at this level. In this case, a constant number of memory cells are distributed also for a threshold voltage Vth=0 in correspondence to occurrence of an overerased bit.

Figure 21:
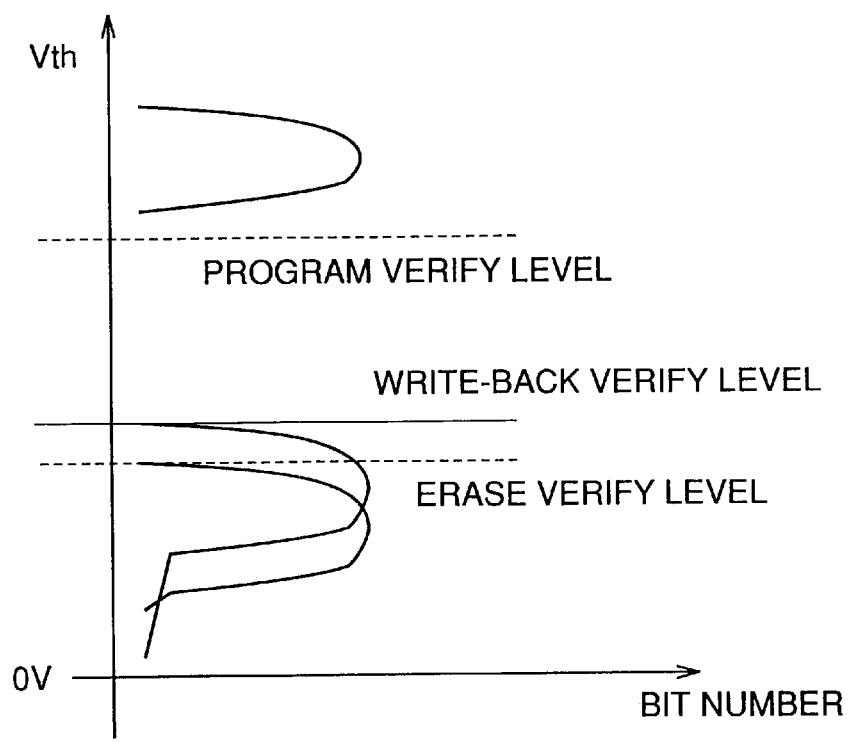
FIG. 21 is a conceptual diagram showing the relation between a program verify level, erase verify levels and threshold distribution of memory cell transistors.

FIG. 21 is a conceptual diagram showing the relation between a program verify level and erase verify levels and threshold distribution of memory cell transistors in an erase method according to the ninth embodiment.

According to the ninth embodiment, the verify level generation circuit 100 generates two types of erase verify levels while a write & erase control circuit 20 has two erase address pointers, i.e., two address counters.

The first erase verify level is similar to a general erase verify level while the second erase verify level (write-back verify level) is set higher than the first erase verify level for starting addition of a write-back pulse by sensing that threshold voltages Vth of all memory cells reach Vth lower than the second erase verify level.

Figure 22:
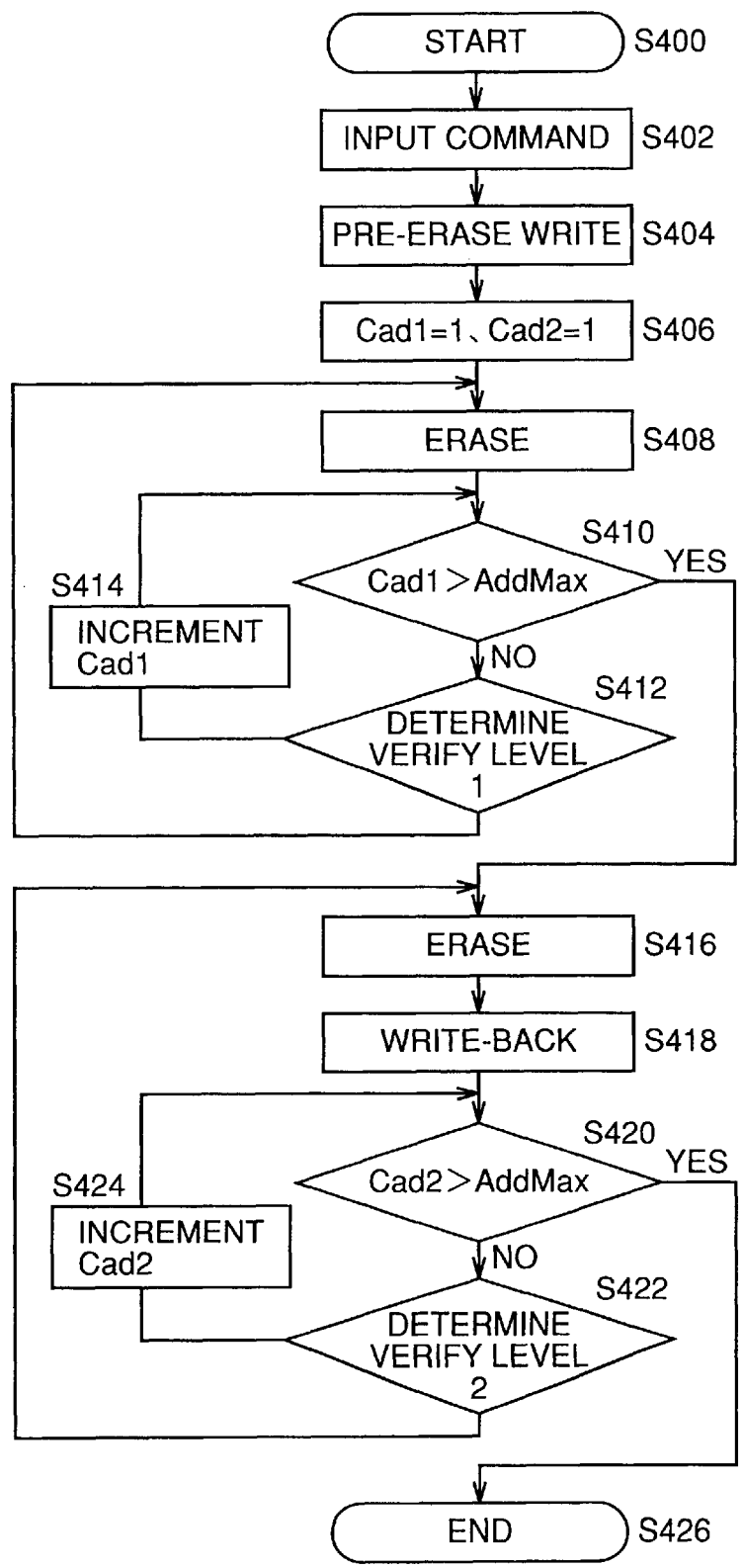
FIG. 22 is a flow chart for illustrating an erase and write-back sequence according to a ninth embodiment of the present invention.

FIG. 22 is a flow chart for illustrating an erase and write-back sequence according to the ninth embodiment.

When the erase and write-back sequence is started (step S400), the following sequence operation is instructed by a command input (step S402).

Then, the thresholds of the memory cells are set to high levels due to a pre-erase write operation (step S404).

On the other hand, the values of two pointer variables Cad1 and Cad2 for specifying an address subjected to erase verification are initialized to 1 (step S406).

An erase pulse is applied to memory cells in each erased block (step S408). Then, the value of the variable Cad1 is compared with the maximum address value AddMax (step S410).

When the value of the variable Cad1 is less than the maximum value AddMax, determination is made at a write-back verify level (verify level 1 in FIG. 22) on the bit of an address corresponding to the variable Cad1. When the threshold of the memory cell transistor is below the write-back verify level (step S412), the variable Cad1 is incremented (step S414) and the process returns to the step S410. When the threshold of the memory cell transistor is in excess of the write-back verify level (step S412), the erase pulse is added again (step S408) and determination is made on this address again (step S412). When the threshold voltage Vth of this address falls below the erase verify level, the variable Cad1 is incremented (step S414) and the process returns to the step S410 for advancing to determination of the next address. When it is determined that the value of the variable Cad1 exceeds the maximum value AddMax and the address reaches the final one at the step S410, the process advances to a step S416.

The erase pulse is applied to memory cells in each erased block (step S416) and a write-back operation is performed for each write-back block (step F418). Then, the value of the variable Cad2 is compared with the maximum address value AddMax (step S420).

When the value of the variable Cad2 is less than the maximum value AddMax, determination is made at an erase verify level (verify level 2 in FIG. 22) smaller than the write-back verify level by a prescribed value on the bit of an address corresponding to the variable Cad2 (step S422). When the threshold of the memory cell transistor is below the erase verify level (step S422), the variable Cad2 is incremented (step S424) and the process returns to the step S420. When the threshold of the memory cell transistor is in excess of the erase verify level (step S422), the erase pulse is added again (step S416), write-back is performed (step S418) and determination is made on this address again (step S422). When the threshold voltage Vth of this address falls below the erase verify level, the variable Cad2 is incremented (step S424) and the process returns to the step S420 for advancing to determination of the next address. When it is determined that the value of the variable Cad2 exceeds the maximum value AddMax and the address reaches the final one at the step S420, the process is ended (step S426).

Also in the ninth embodiment, the write-back block may be identical to the erased block, or the erased block may be further divided. When the erased block is divided, the write-back pulse is successively applied to write-back blocks in the erased block supplied with the erase pulse.

In the conventional erase operation, the verify time required for erasing 1 Mbit is up to about 33 msec., depending on the structure of the device.

For example, 2048 (number of bits in the WL direction)× 512 (number of bits on BL)÷16 (number of bits simultaneously subjected to verification)×500 nsec. (time required for single verification)=32.7 msec.

When performing binarized verification, the time required for entire verification is up to about 66 msec. Assuming that write-back is started when the maximum threshold Vth.max reaches 4 V at an erase pulse width of 5 msec. similarly to the case of FIG. 16, for example, write-back can be omitted up to 800 msec. i.e., while the erase pulse is applied 160 times.

Assuming that each write-back time is 1 msec., a write-back time of 160 msec. is reduced and only 33 msec. is used for determining start of the write-back, and hence it follows that up to 130 msec. can be reduced.

Consequently, write-back can be reliably performed and increase of the erase time can be suppressed while determining the state of the erase threshold Vth distribution.

Tenth Embodiment

A write-back method according to a tenth embodiment of the present invention is characterized in that, in a nonvolatile semiconductor memory device employing a method of selecting a bit line in a non-selected state of a word line, self-selectively writing back only an overerased cell on the selected bit line and performing application of an erase pulse and write-back as a set while performing no write-back in an initial stage of an erase operation, a write-back pulse is added by sensing that a threshold Vth on a lower side of post-erase threshold Vth distribution reaches a value below a certain value.

In other words, an erase and write-back method according to the tenth embodiment is characterized in that write-back is started by sensing that the minimum threshold voltage Vth.min reaches a level below a certain critical value in the write-back method according to the seventh embodiment.

This sensing is enabled by employing the sum of off-state leakage values in subblocks sharing a sense amplifier as in the structure shown in the fourth or fifth embodiment, for example.

As shown in FIG. 12, a certain erased block can generally be divided into subblocks sharing a sense amplifier. In the erase and write-back method according to the tenth embodiment, a Y gate part selects all bit lines in the subblocks of each block in the write-back operation for determining the sum of off-state leakage with the sense amplifier.

In an initial stage of erasing, i.e., when the peak threshold voltage Vth.peak is in a high Vth state, the sum of off-state leakage is not more than 1 µA, as shown in FIG. 6 or 10.

When erasing progresses and the peak threshold Vth.peak is reduced, however, the value of off-state leakage is increased. This increase can be predicted as shown in FIGS. 6 or 10.

When an overerased cell is present in the subblock or some bits of cells not overerased but almost overerased, in which off-state leakage flows, are present on the same bit line, however, the sum of off-state leakage is somewhat greater than the predicated value.

Therefore, a circuit changing sense current sensitivity for write-back determination is provided on the sense amplifier, i.e., a circuit capable setting the sense current sensitivity to a level smaller than that in a general read state is provided as shown in FIG. 13, for example, so that determination as to whether or not addition of a write-back pulse to each subblock is necessary by observing whether or not the sum of off-state leakage values of the subblock reaches the value.

Figure 23:
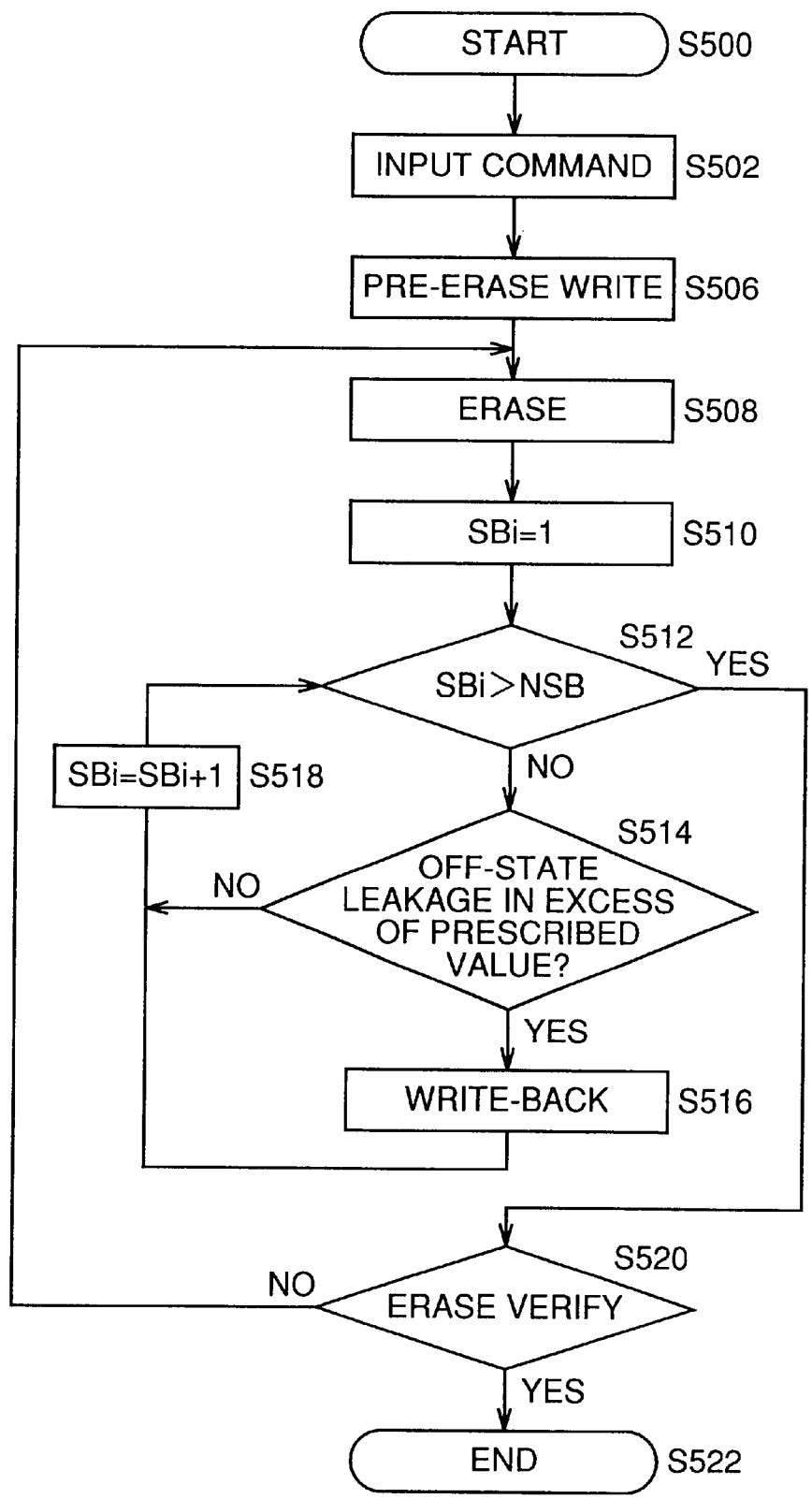
FIG. 23 is a flow chart for illustrating an erase and write-back sequence according to a tenth embodiment of the present invention.

FIG. 23 is a flow chart for illustrating an erase and write-back sequence according to the tenth embodiment.

When the erase and write-back sequence is started (step S500), the following sequence operation is instructed by a command input (step S502). Then, the thresholds of memory cells are set to high levels due to a pre-erase write operation (step S506).

An erase pulse is applied to memory cells in each erased block (step S508).

Then, the value of a pointer variable SBi for specifying a subblock subjected to determination of the sum of off-state leakage is initialized to 1 (step S510). Then, the value of the variable SBi is compared with the number NSB of the subblocks (step S512).

When the value of the variable SBi is less than the number NSB of the subblocks, current sensitivity of a sense amplifier is changed for the subblock corresponding to the variable SBi and determination is made as to whether or not the quantity of off-state leakage is in excess of a prescribed value (step S514). If the quantity of off-state leakage is less than the prescribed value (step S514), the variable SBi is incremented (step S518) and the process returns to the step S512. If the quantity of off-state leakage is in excess of the prescribed value (step S514), the subblock corresponding to the variable SBi is written back (step S516). After the write-back, the variable SBi is incremented (step S518) and the process returns to the step S512 for advancing to determination of the next subblock. If it is determined at the step S512 that the value of the variable SBi exceeds the number NSB of the subblocks and write-back is completed up to the final subblock, the process advances to a step S520.

In an erase verify operation, the process returns to the step S508 if it is determined that thresholds of memory cells in an erased block do not reach a prescribed value (step S520), while the process is ended (step S522) if it is determined that the thresholds of all memory cells reach the prescribed level (step S520).

Application of an erase pulse and a write-back pulse may be started to the overall blocks if at least one subblock reaches the determination value, as a matter of course.

Figure 24:
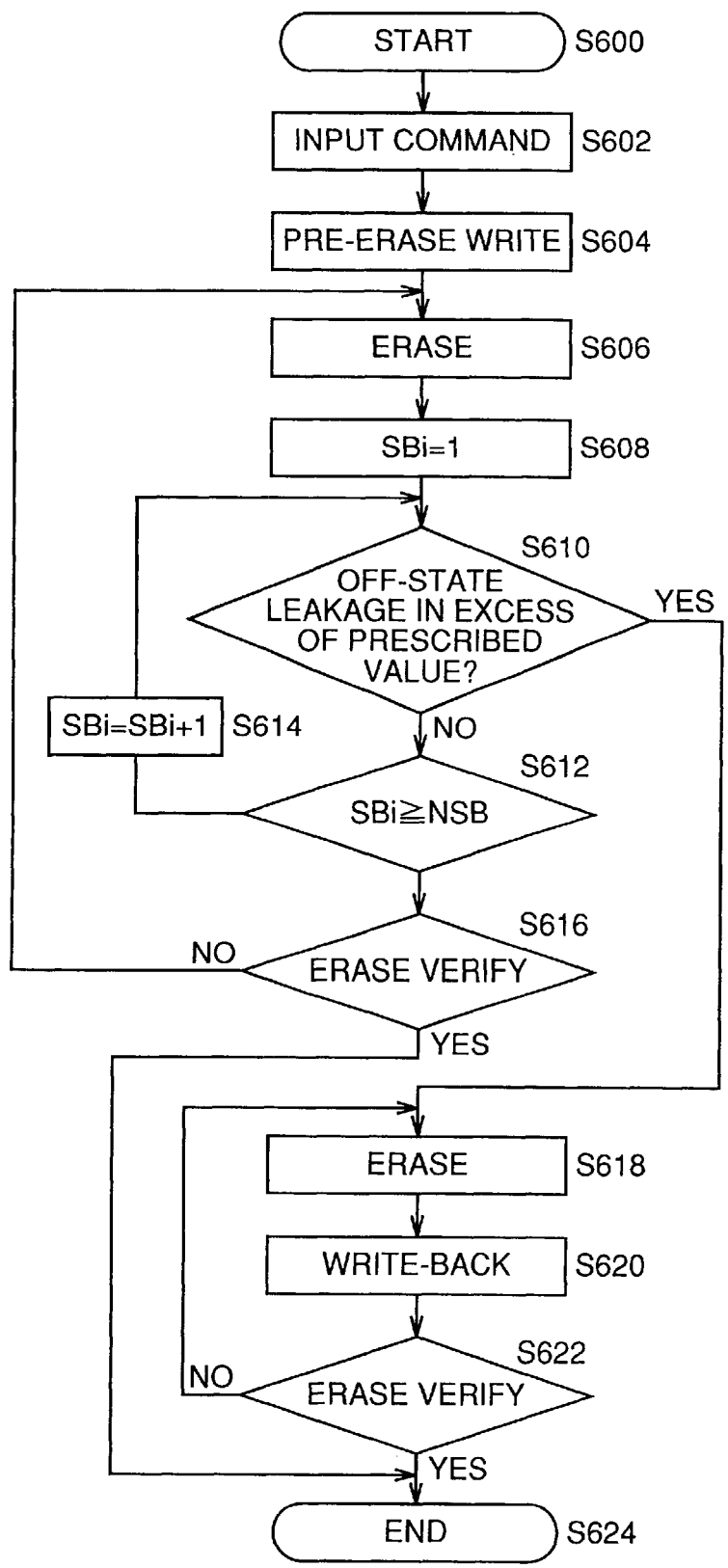
FIG. 24 is a flow chart for illustrating an erase and write-back sequence.
Figure 25:
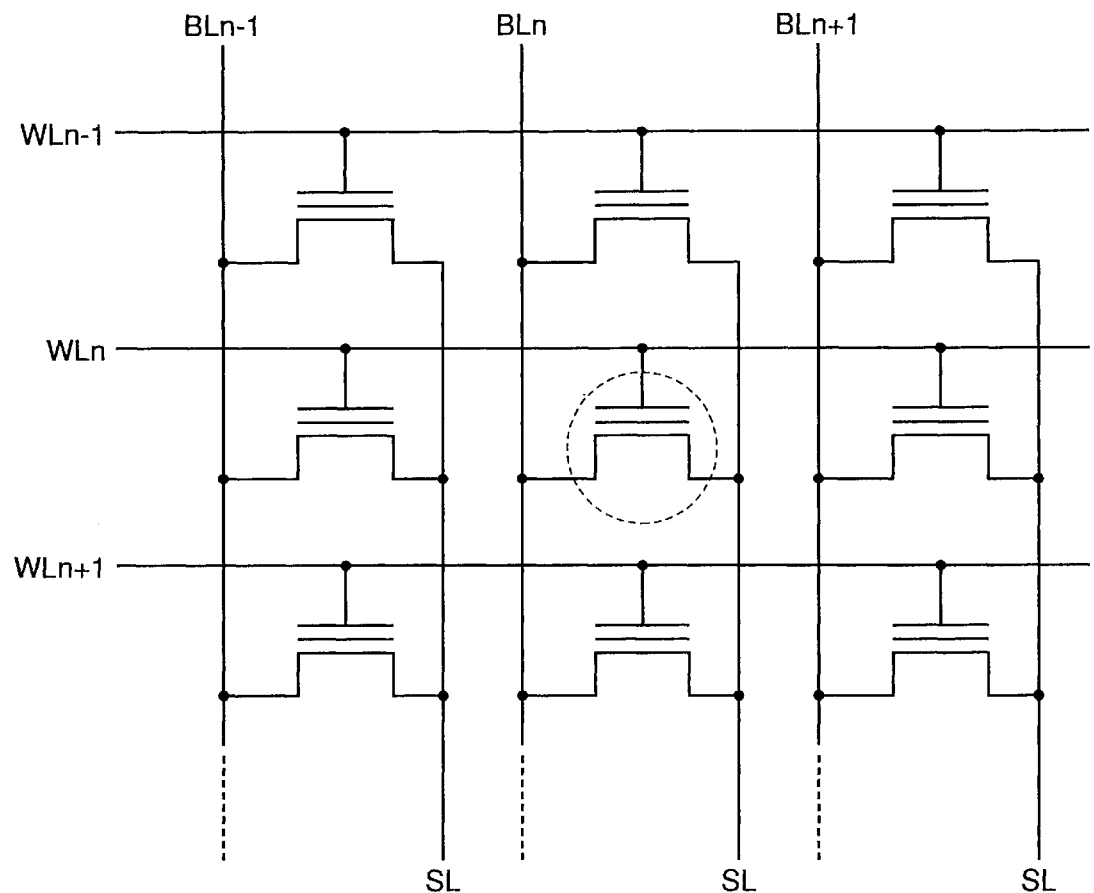
FIG. 25 is a circuit block diagram showing a memory cell array in a conventional nonvolatile semiconductor memory device such as a flash memory.
Figure 26:
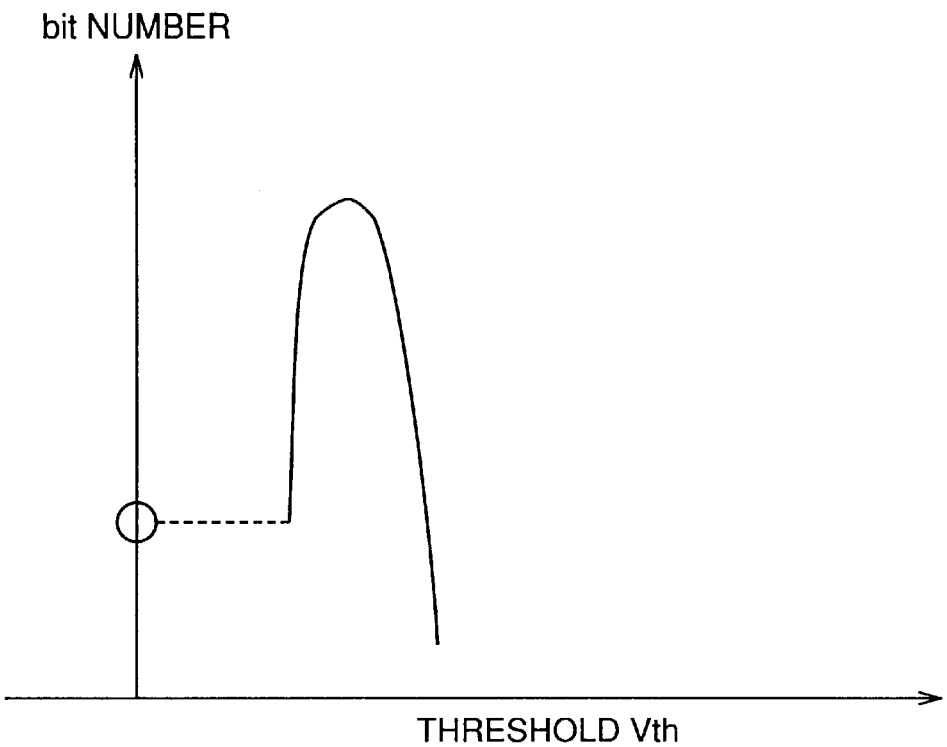
FIG. 26 illustrates apparent threshold voltage distribution of memory cell transistors including an overerased memory cell.
Figure 27:
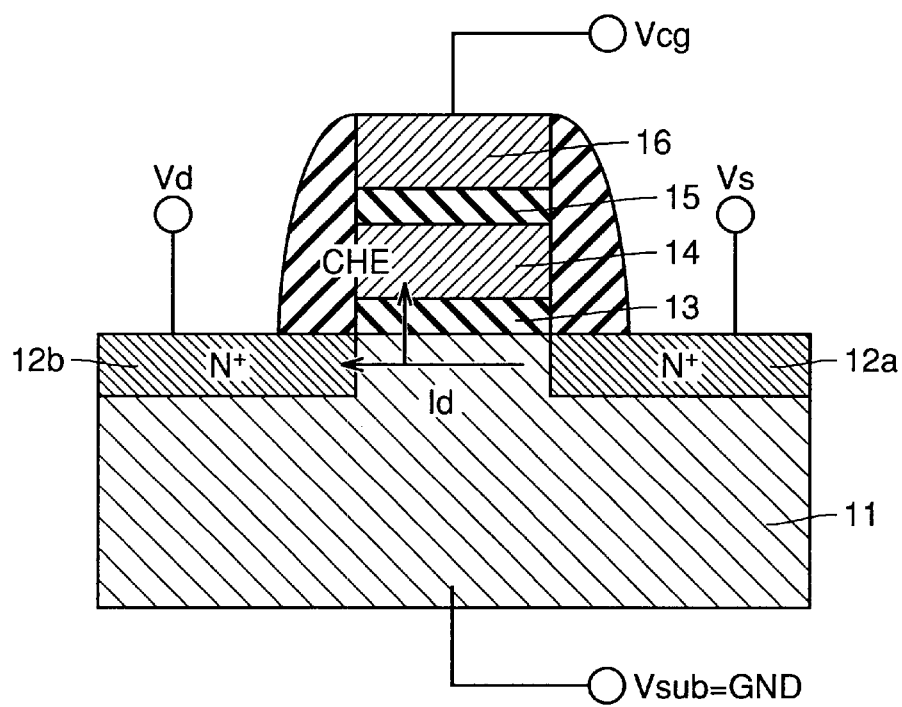
FIG. 27 is a schematic sectional view for illustrating overerased bit write-back with CHE.
Figure 28:
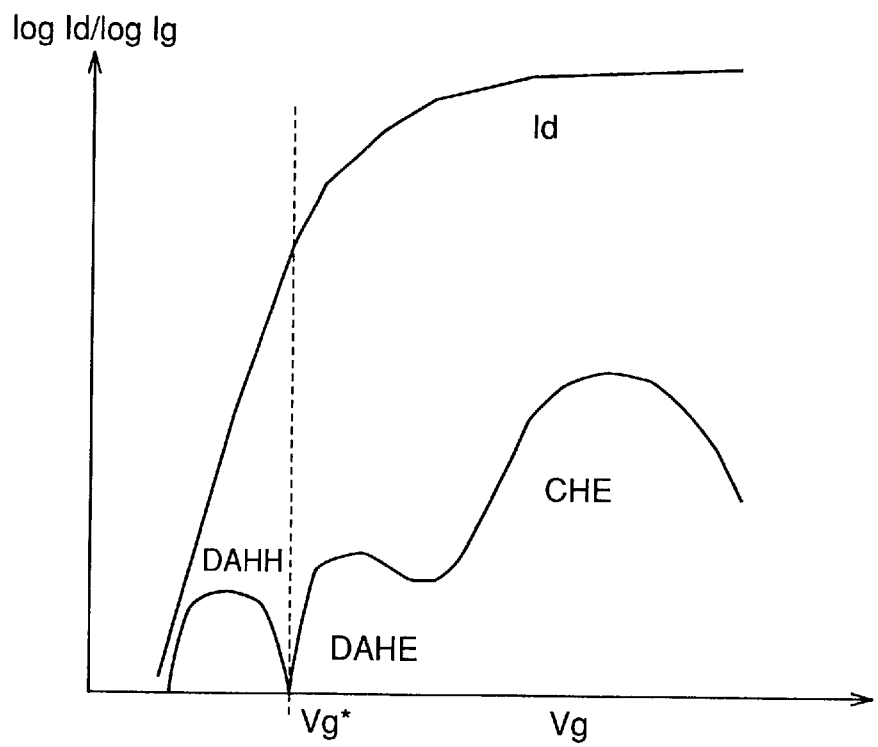
FIG. 28 is a conceptual diagram showing gate voltage Vg dependency of logarithmic values of a drain current Id and a gate current Ig of a flash memory cell.
Figure 29:
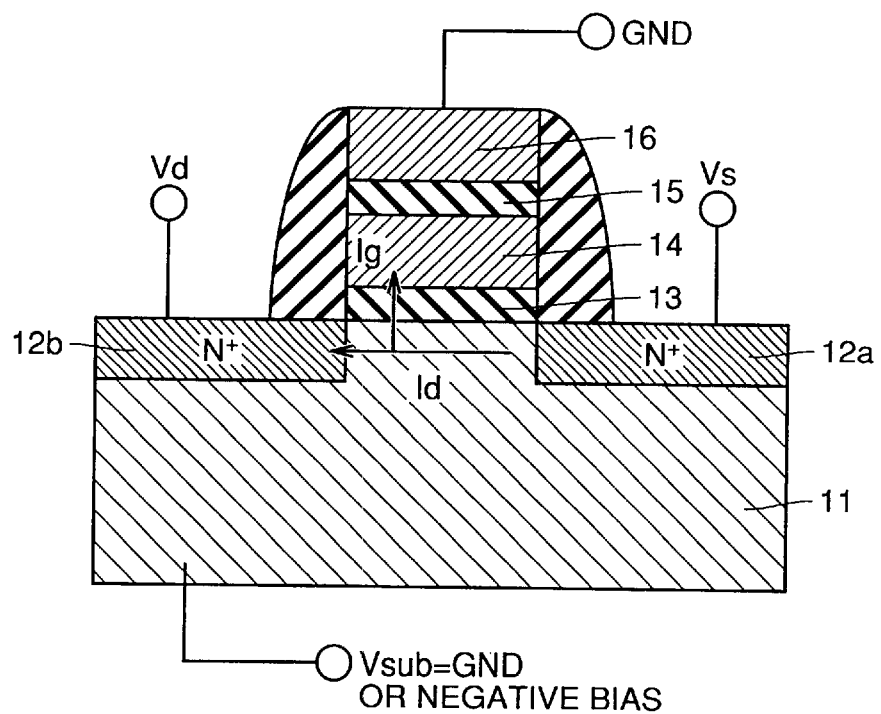
FIG. 29 is a schematic sectional view of a flash memory cell for illustrating conventional overerased bit write-back with DAHE/DAHH.
Figure 30:
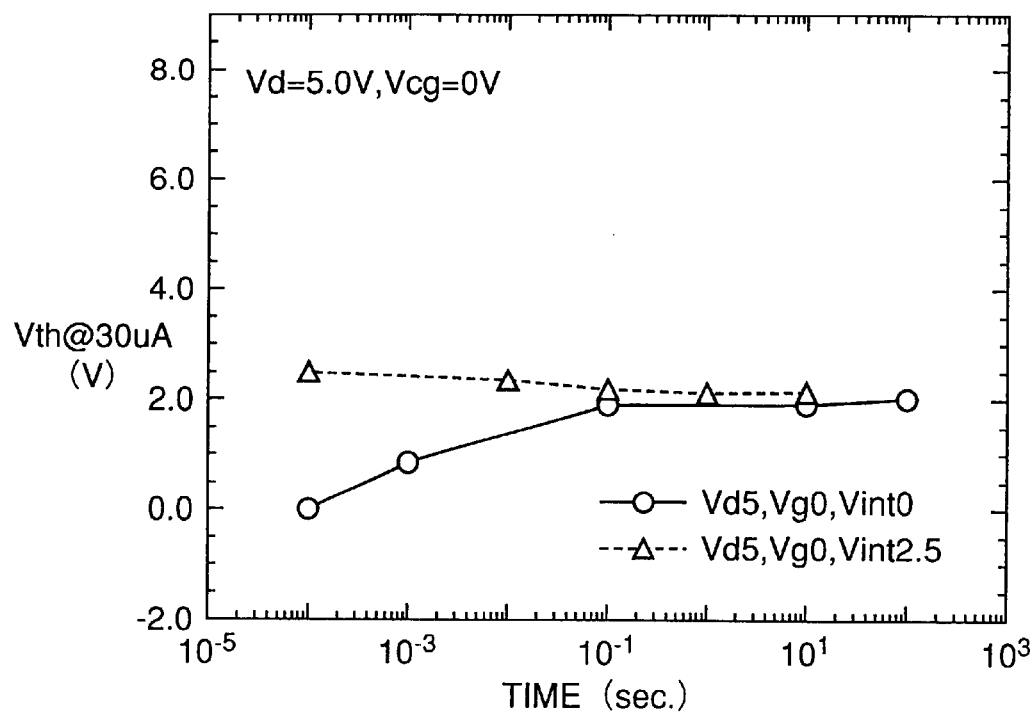
FIG. 30 illustrates a result of evaluation of the overerased bit write-back with DAHE/DAHH as time change of threshold voltages in a single cell.
Figure 31:
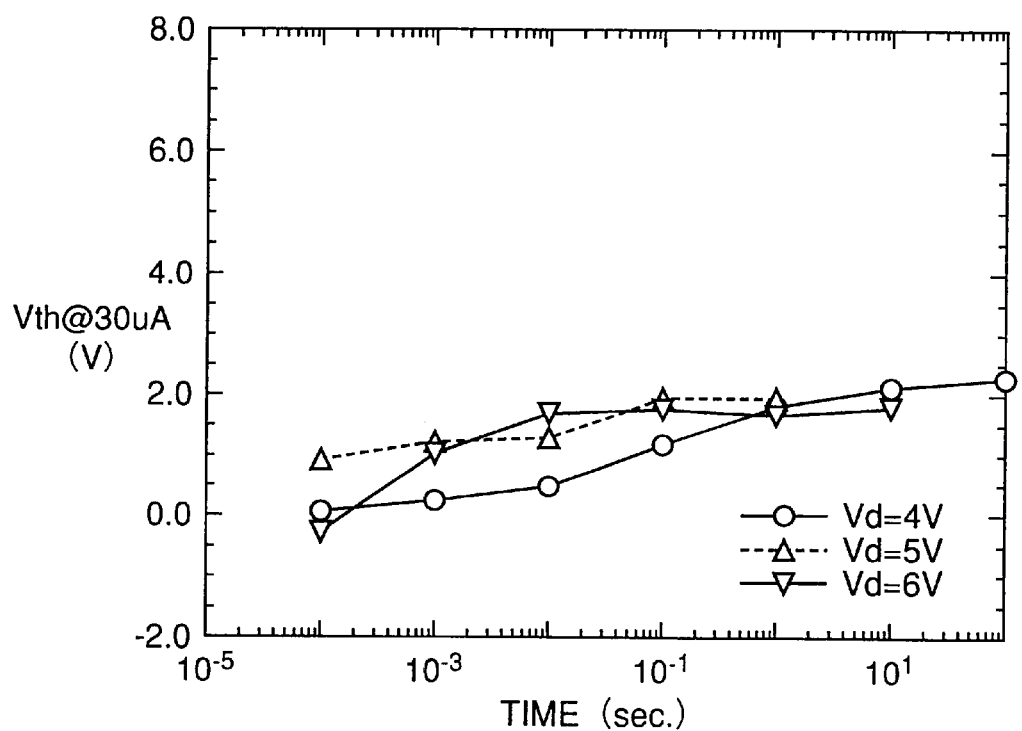
FIG. 31 shows drain voltage dependency in the overerased bit write-back method with DAHE/DAHH.
Figure 32:
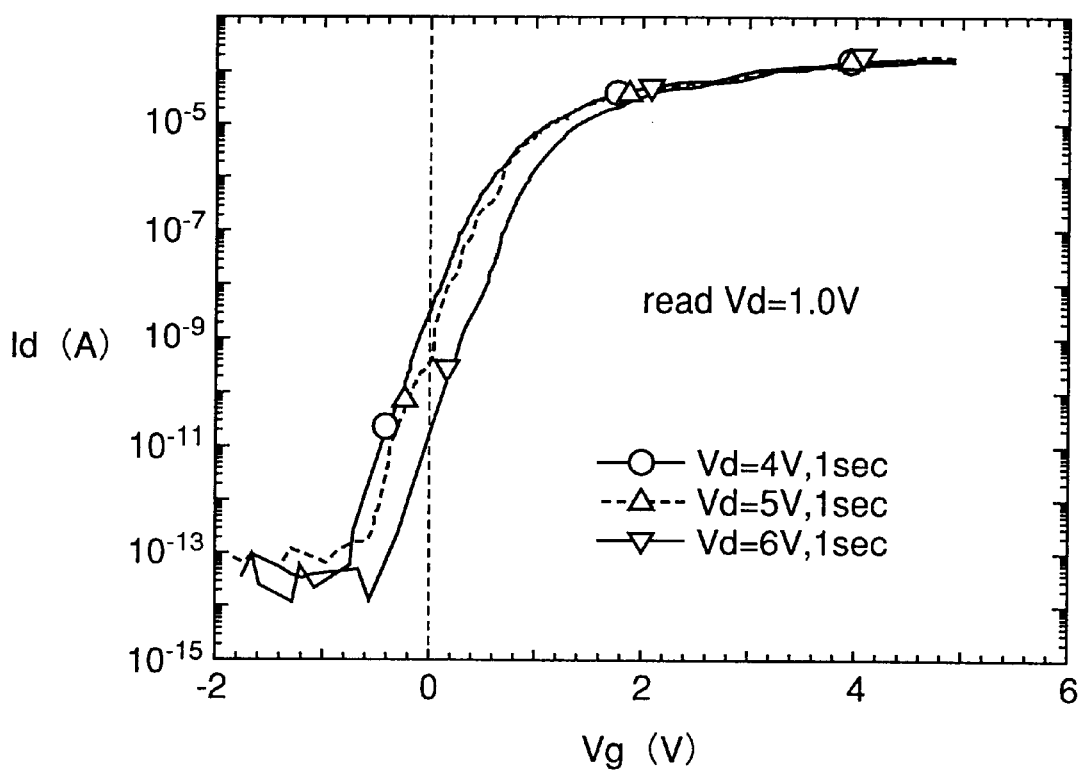
FIG. 32 illustrates gate voltage-to-drain current characteristics (Vg–Id characteristics) of a cell reaching a convergence threshold voltage Vthc.
Figure 33:
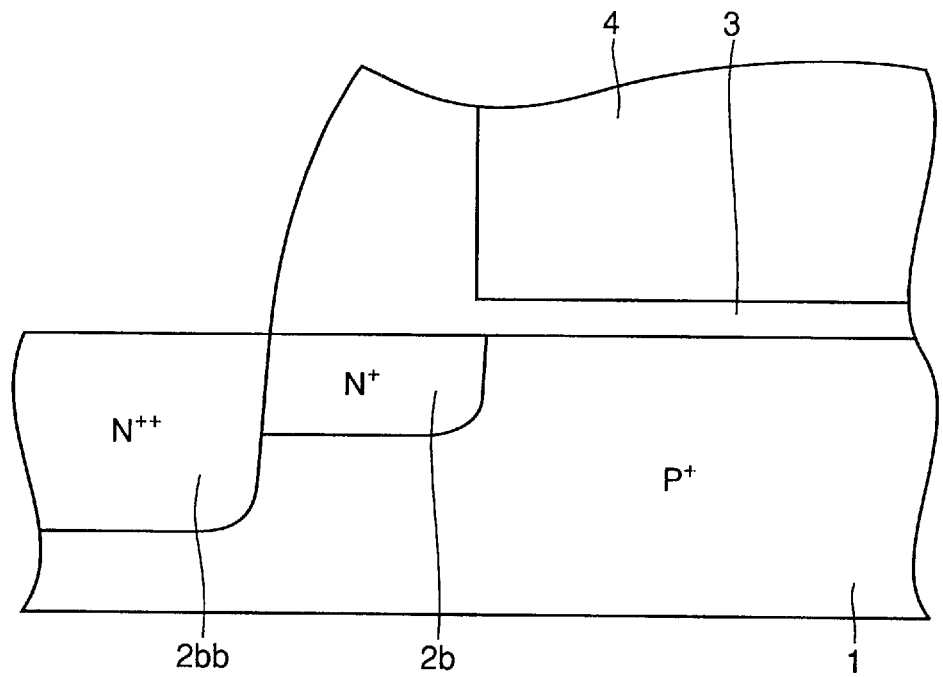
FIG. 33 is a conceptual diagram showing the structure of a section of a drain part of a memory cell transistor to be written back.
Figure 34:
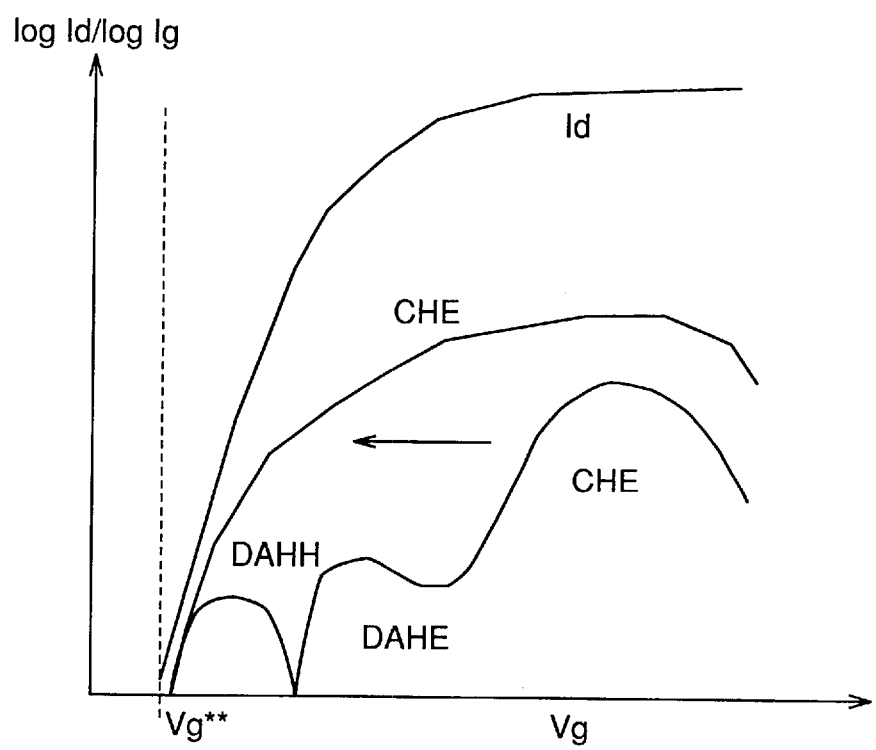
FIG. 34 illustrates gate voltage Vg dependency of a gate current Ig under operating conditions enabling write-back with subthreshold CHE.
Figure 35:
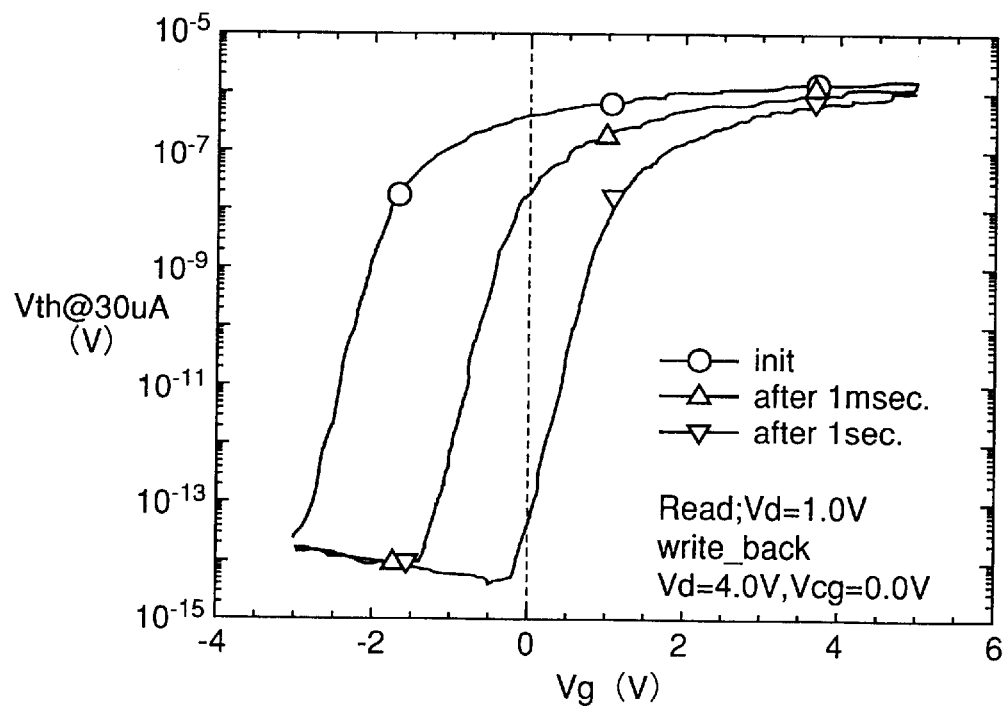
FIG. 35 illustrates gate voltage-to-drain current characteristics (Vg–Id characteristics) of cells after overerased bit write-back with subthreshold CHE.
Figure 36:
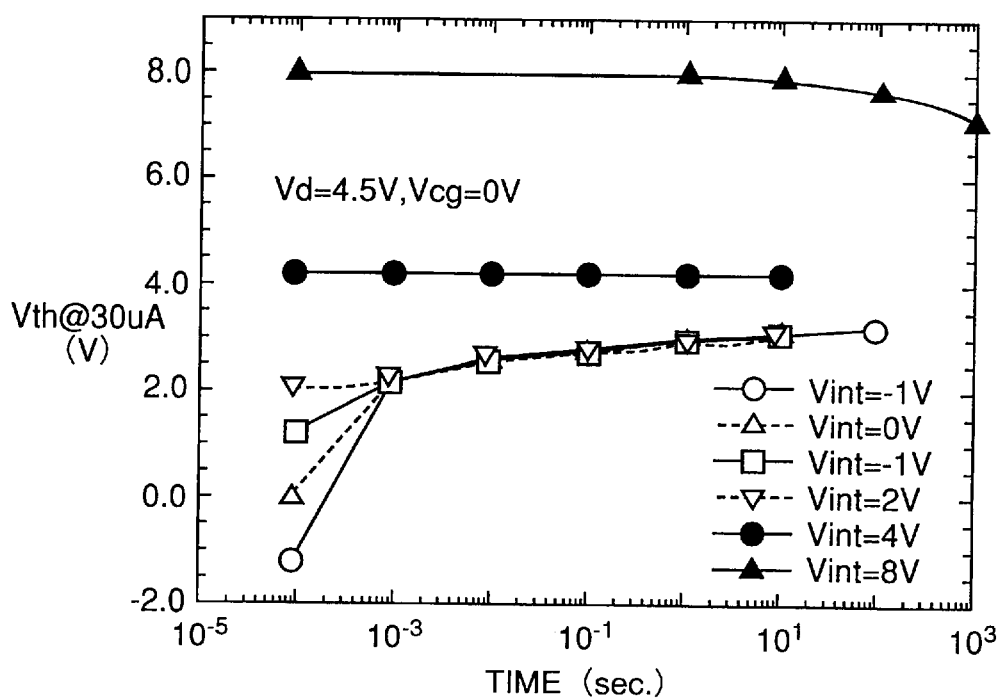
FIG. 36 illustrates initial threshold dependency of time fluctuation of thresholds in write-back with subthreshold CHE.
Figure 37:
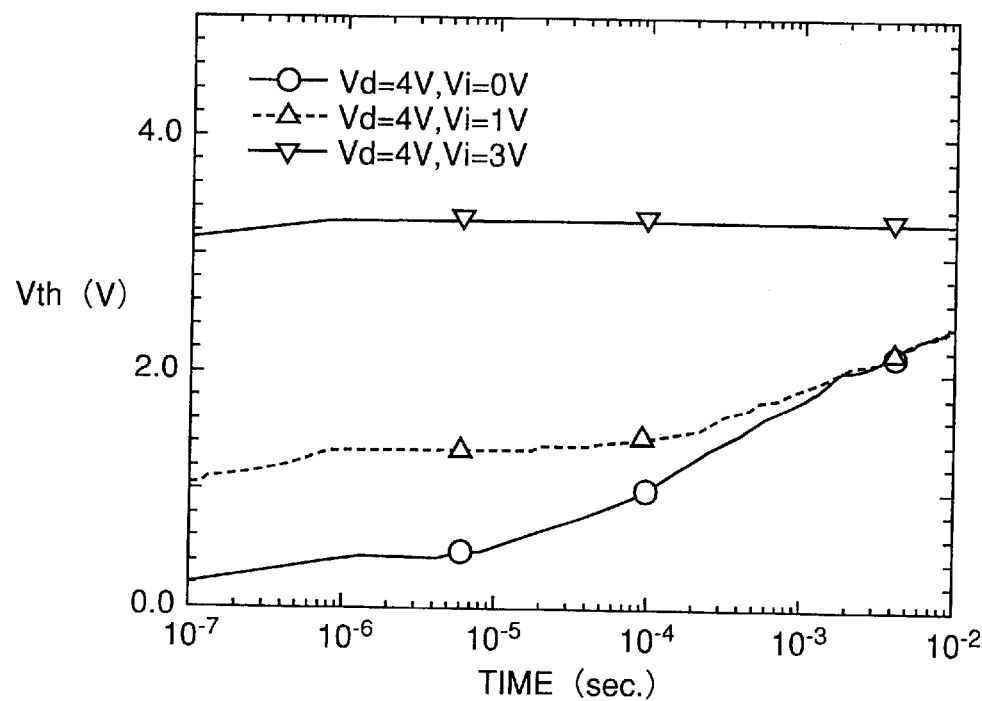
FIG. 37 is a diagram for illustrating convergence times of thresholds in write-back with subthreshold CHE.
Figure 38:
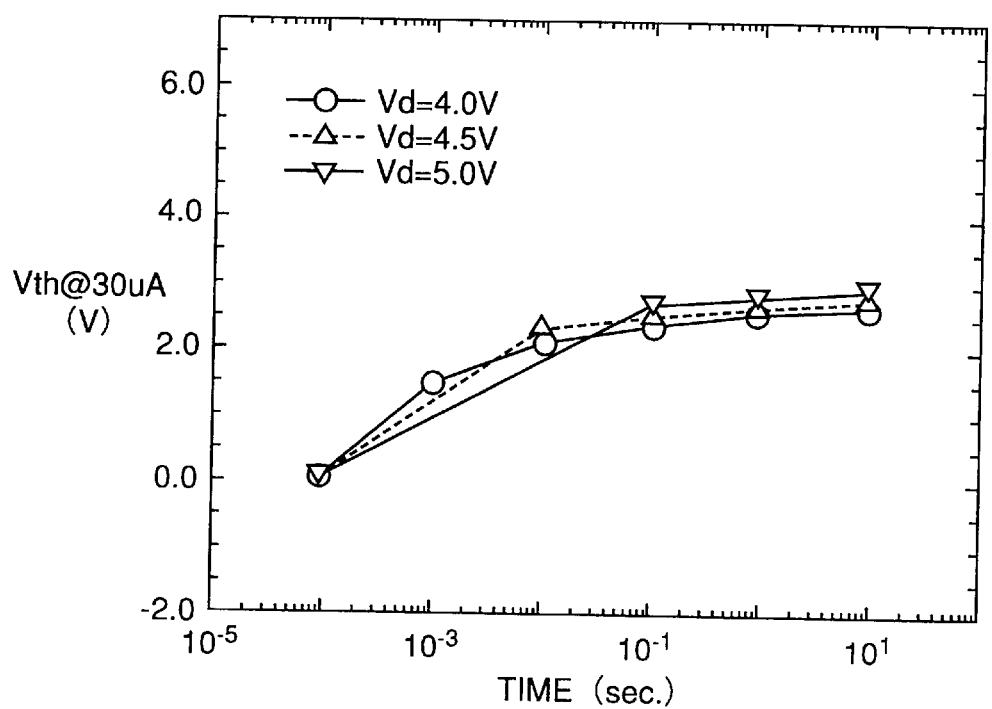
FIG. 38 is a diagram for illustrating applied drain voltage dependency of convergence of thresholds in write-back with subthreshold CHE.
Figure 39:
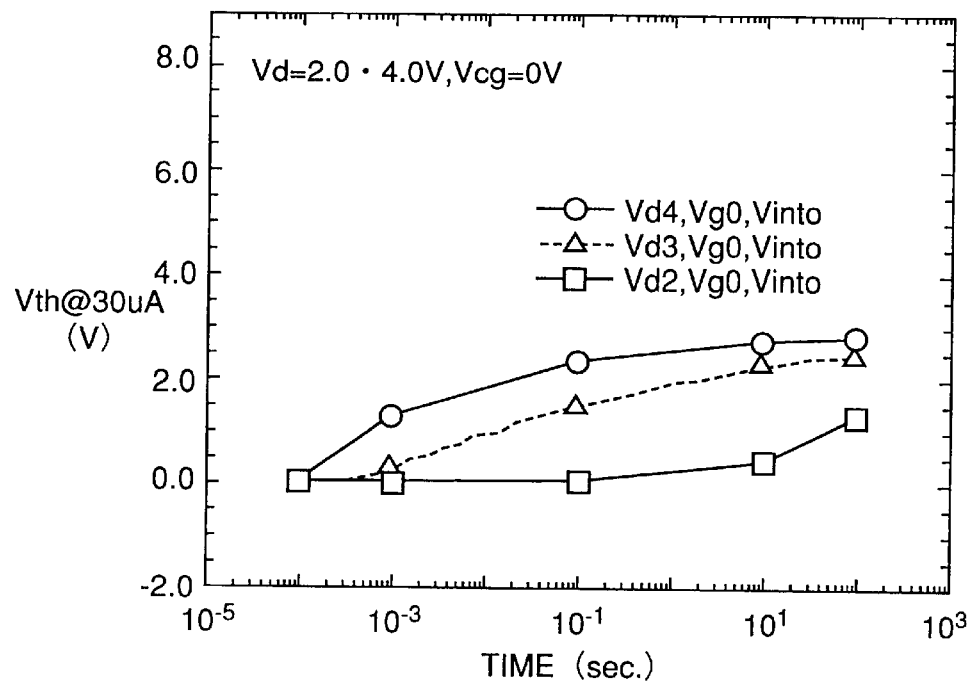
FIG. 39 is a diagram for illustrating applied drain voltage dependency of convergence of thresholds in write-back with subthreshold CHE.
Figure 40:
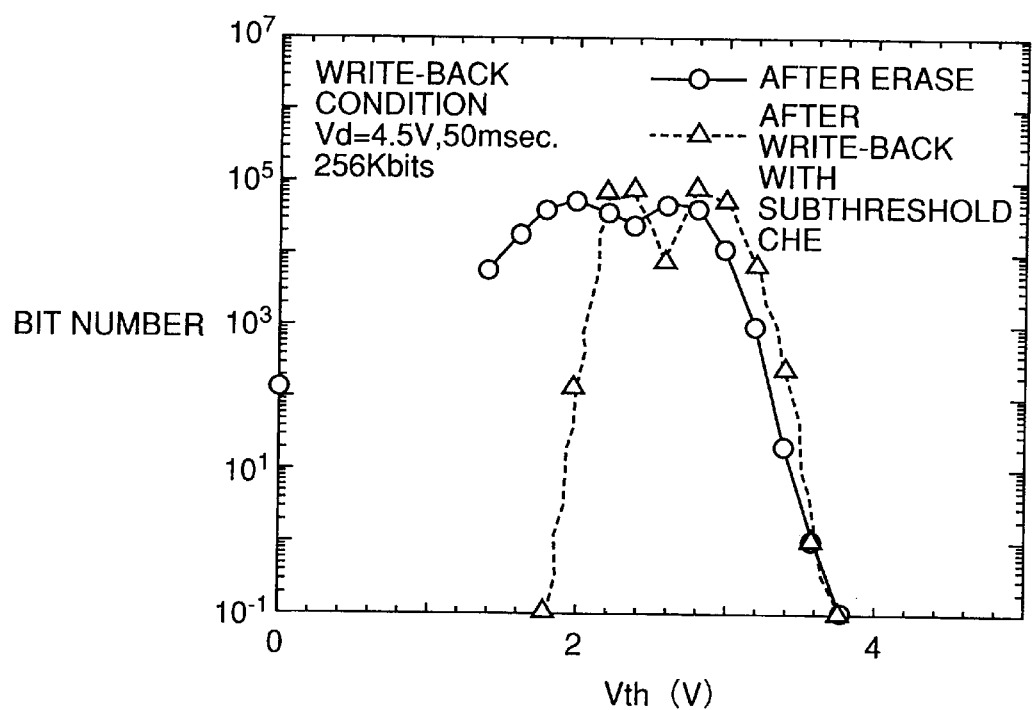
FIG. 40 illustrates distribution of threshold voltages after performing write-back with subthreshold CHE on a 256-Kbit array.

FIG. 24 is a flow chart for illustrating an erase and write-back sequence in this case.

In processing through steps S600 to S616, an erase operation and an erase verify operation are repeated until a subblock having an off-state leakage value exceeding a prescribed value appears.

If at least one subblock having an off-state leakage value exceeding the prescribed value appears, the process advances to a step S618 for performing erasing and write-back similarly to the operation described with reference to FIG. 14.

When employing the determination method according to the tenth embodiment, it is also possible to design the device to stop application of the write-back pulse until a new overerased cell appears if off-state leakage falls below a determination value, i.e., if the number of overerased states is written back upon single application of a write-back pulse.

Consequently, overerased cells can be reliably determined and a reliable write-back operation can be performed while increase of the erase time can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An erase method for a nonvolatile semiconductor memory device, comprising steps of:
    repeating a collective erase operation for a memory cell block including a plurality of memory cell transistors and an erase verify operation until the thresholds of said memory cell transistors fall below a prescribed verify level; and
    bringing a word line into a non-selected state and collectively performing a self-selective write-back operation for a memory cell in an overerased state on a selected bit line with respect to subblocks each including said memory cell transistors of a bit number less than the bit number of said memory cell block after completion of said erase verify operation.

2. The erase method for a nonvolatile semiconductor memory device according to claim 1, wherein
    the thresholds of said memory cell transistors are determined by a sense amplifier in said era se verify operation, said subblocks are provided in correspondence to sense amplifier subblocks including a plurality of said sense amplifiers, and each said sense amplifier subblock is operable independently of the remaining said sense amplifier blocks.

3. The erase method for a nonvolatile semiconductor memory device according to claim 2, further comprising a step of determining whether or not to perform a write-back operation on corresponding said subblocks by said sense amplifiers included in said sense amplifier blocks.

4. An erase method for a nonvolatile semiconductor memory device, comprising steps of:

performing a collective erase operation for a memory cell block including a plurality of memory cell transistors;

bringing a word line into a non-selected state and collectively performing a self-selective write-back operation for a memory cell in an overerased state on a selected bit line with respect to a plurality of said memory cell transistors; and repeating said erase operation and said write-back operation until the thresholds of said memory cell transistors fall below a prescribed verify level.

5. The erase method for a nonvolatile semiconductor memory device according to claims 4, further comprising a step of repeating said erase operation and an operation of determining whether or not the thresholds of said memory cell transistors fall below said prescribed verify level until performing said erase operation by a prescribed count.

6. The erase method for a nonvolatile semiconductor memory device according to claim 4, further comprising a step of reducing the pulse width of an erase pulse supplied to said memory cell transistors in said erase operation following increase of the count of said erase operation.

7. An erase method for a nonvolatile semiconductor memory device, comprising steps of:

repeating a collective erase operation on a memory cell block until the threshold of a memory cell transistor in said memory cell block falls below a first prescribed verify level;

performing a collective erase operation on said memory cell block after the threshold of said memory cell transistor in said memory cell block falls below said first prescribed verify level;

bringing a word line into a non-selected state and collectively performing a self-selective write-back operation for a memory cell in an overerased state on a selected bit line with respect to a plurality of said memory cell transistors; and repeating said erase operation and said write-back operation until the thresholds of said memory cell transistors fall below a second prescribed verify level lower than said first prescribed verify level.

8. An erase method for a nonvolatile semiconductor memory device, comprising steps of:

performing a collective erase operation on a memory cell block including a plurality of memory cell transistors;

determining whether or not the sum of leakage currents in off states is in excess of a prescribed value as to a plurality of said memory cell transistors;

bringing a word line into a non-selected state and collectively performing a self-selective write-back operation for a memory cell in an overerased state on a selected bit line with respect to a plurality of said memory cell transistors when the sum of said leakage currents is in excess of said prescribed value; and repeating said erase operation, said determination and said write-back operation until the thresholds of said memory cell transistors fall below a prescribed verify level.

* * * * *